(12) United States Patent
Heo et al.

(10) Patent No.: US 11,495,761 B2
(45) Date of Patent: Nov. 8, 2022

(54) PHOTOELECTRIC CONVERSION DEVICES AND ORGANIC SENSORS AND ELECTRONIC DEVICES

(71) Applicant: Samsung Electronics Co., Ltd., Suwon-si (KR)

(72) Inventors: Chui Joon Heo, Busan (KR); Kyung Bae Park, Hwaseong-si (KR); Sung Jun Park, Yongin-si (KR); Sung Young Yun, Suwon-si (KR); Gae Hwang Lee, Seongnam-si (KR); Chui Baik, Suwon-si (KR); Ji Soo Shin, Seoul (KR); Yong Wan Jin, Seoul (KR); Hye Rim Hong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 16 days.

(21) Appl. No.: 16/815,481

(22) Filed: Mar. 11, 2020

(65) Prior Publication Data

US 2020/0365661 A1  Nov. 19, 2020

(30) Foreign Application Priority Data

May 17, 2019  (KR) .......................... 10-2019-0058236

(51) Int. Cl.
*H01L 51/42* (2006.01)
*H01L 27/30* (2006.01)

(52) U.S. Cl.
CPC ............ *H01L 51/42* (2013.01); *H01L 27/307* (2013.01); *H01L 2251/301* (2013.01)

(58) Field of Classification Search
CPC . H01L 27/307; H01L 51/42; H01L 2251/301; H01L 51/442; H01L 51/4273;
(Continued)

(56) References Cited

U.S. PATENT DOCUMENTS 8,529,308 B2    9/2013  Sakanoue et al.
8,592,804 B2 *  11/2013 Rand ..................... H01L 51/442
                                                    257/40
(Continued)

FOREIGN PATENT DOCUMENTS

EP        2256839 A2     12/2010
JP     2009-182095 A      8/2009
(Continued)

OTHER PUBLICATIONS

Extended European Search Report dated Oct. 16, 2020 for corresponding European Application No. 20171348.4.

*Primary Examiner* — Shouxiang Hu
(74) *Attorney, Agent, or Firm* — Harness, Dickey & Pierce, P.L.C.

(57) ABSTRACT

A photoelectric conversion device includes a first electrode and a second electrode facing each other, an organic photoelectric conversion layer between the first electrode and the second electrode, and a charge auxiliary layer between the first electrode and the organic photoelectric conversion layer. The organic photoelectric conversion layer is configured to absorb light in at least a portion of a wavelength spectrum of incident light and to convert the absorbed light into an electrical signal. The charge auxiliary layer includes a metal and an oxide. The oxide may be an oxide material that excludes silicon oxide such that the charge auxiliary layer does not include silicon oxide.

17 Claims, 22 Drawing Sheets

(58) Field of Classification Search
CPC ............... H01L 51/44; H01L 51/0001; H01L 2251/303; H01L 51/4206; H01L 51/424; H01L 51/4293; H01L 27/146; H01L 51/5072; H01L 51/5096; H01L 51/5215

See application file for complete search history.

(56) References Cited

U.S. PATENT DOCUMENTS

| | | |
|---|---|---|
| 8,592,931 B2 | 11/2013 | Hayashi et al. |
| 8,748,945 B2 | 6/2014 | Shin |
| 8,928,784 B2 | 1/2015 | Watanabe et al. |
| 9,356,067 B2 | 5/2016 | Shin |
| 9,397,248 B2 * | 7/2016 | Lim .................... H01L 31/056 |
| 9,425,240 B2 | 8/2016 | Liang et al. |
| 9,806,263 B2 | 10/2017 | Mitchell et al. |
| 10,181,497 B2 | 1/2019 | Heo et al. |
| 10,297,766 B2 | 5/2019 | Nakata et al. |
| 10,439,147 B2 | 10/2019 | Kathirgamanathan |
| 10,505,146 B2 | 12/2019 | Heo et al. |
| 10,546,897 B2 | 1/2020 | Yun et al. |
| 2009/0284141 A1 | 11/2009 | Sakanoue et al. |
| 2014/0209173 A1 | 7/2014 | Momose |
| 2014/0239271 A1 | 8/2014 | Leem et al. |
| 2016/0013248 A1 | 1/2016 | Sawaki |
| 2017/0186984 A1 | 6/2017 | Hosono et al. |
| 2017/0294485 A1 | 10/2017 | Joei et al. |
| 2017/0338271 A1 * | 11/2017 | Jin .................... H01L 27/14629 |
| 2018/0375033 A1 | 12/2018 | Yakushiji et al. |
| 2019/0123283 A1 | 4/2019 | Kathirgamanathan |
| 2021/0265582 A1 * | 8/2021 | Hirata ............... H01L 27/14636 |

FOREIGN PATENT DOCUMENTS

| | | |
|---|---|---|
| JP | 2009-277788 A | 11/2009 |
| JP | 4816768 B2 | 11/2011 |
| JP | 2015-015415 A | 1/2015 |
| JP | 2018-188617 A | 11/2018 |
| KR | 2015-0139929 A | 12/2015 |
| KR | 2016-0076528 A | 6/2016 |
| KR | 2016-0082498 A | 7/2016 |
| KR | 2017-0087049 A | 7/2017 |
| KR | 2018-0024296 A | 3/2018 |
| KR | 10-1845257 B1 | 4/2018 |
| KR | 2018-0044761 A | 5/2018 |
| WO | WO-2018/077660 A1 | 5/2018 |

* cited by examiner

PHOTOELECTRIC CONVERSION DEVICES AND ORGANIC SENSORS AND ELECTRONIC DEVICES

CROSS-REFERENCE TO RELATED APPLICATION

This application claims priority to and the benefit of Korean Patent Application No. 10-2019-0058236 filed in the Korean Intellectual Property Office on May 17, 2019, the entire contents of which are incorporated herein by reference.

BACKGROUND

1. Field

Photoelectric conversion devices, organic sensors, and electronic devices are disclosed.

2. Description of the Related Art

A photoelectric conversion device may receive incident light and convert the received incident light into an electrical signal. A photoelectric conversion device may include a photodiode and a phototransistor, and may be applied to an organic sensor, a photodetector, a solar cell, or the like.

Organic sensors may have higher resolutions and thus may have smaller pixel sizes. Organic sensors may include silicon photodiodes. A sensitivity of a silicon photodiode in an organic sensor may be deteriorated based on reduced pixel size of the organic sensor and reduced absorption area of the silicon photodiode. Accordingly, organic materials that are capable of replacing silicon in photodiodes of organic sensors have been researched.

An organic material has a high extinction coefficient and is configured to selectively absorb light in a particular wavelength spectrum of light depending on a molecular structure of the organic material, and thus may simultaneously replace a photodiode and a color filter of an organic sensor and resultantly improve sensitivity of the organic sensor and contribute to high integration of the organic sensor.

However, since such organic materials exhibit different characteristics from those of silicon due to high binding energy and a recombination behavior associated with such organic materials, the characteristics of the organic material are difficult to precisely predict, and thus required properties of a photoelectric conversion device may not be easily controlled.

SUMMARY

Some example embodiments provide one or more photoelectric conversion devices capable of improving charge extraction efficiency.

Some example embodiments provide organic sensors including one or more of the photoelectric conversion device.

Some example embodiments provide electronic devices including one or more photoelectric conversion devices or one or more organic sensors.

According to some example embodiments, a photoelectric conversion device may include a first electrode and a second electrode facing each other, an organic photoelectric conversion layer between the first electrode and the second electrode, and a charge auxiliary layer between the first electrode and the organic photoelectric conversion layer. The organic photoelectric conversion layer may be configured to absorb light in at least a portion of a wavelength spectrum of incident light and to convert the absorbed light into an electrical signal. The charge auxiliary layer may include a metal and an oxide, the oxide being an oxide material that excludes silicon oxide such that the charge auxiliary layer does not include silicon oxide.

The metal may include a lanthanide element, calcium (Ca), potassium (K), aluminum (Al), an alloy thereof, or a combination thereof.

The lanthanide element may include ytterbium (Yb).

The oxide may have an energy bandgap of about 4.5 eV to about 7.5 eV.

The oxide may include germanium oxide, aluminum oxide, gallium oxide, selenium oxide, strontium oxide, lanthanum oxide, neodymium oxide, gadolinium oxide, ytterbium oxide, lutetium oxide, or a combination thereof.

The charge auxiliary layer may include a mixture of the metal and the oxide.

A total amount of the oxide in the charge auxiliary layer may be greater than a total amount of the metal in the charge auxiliary layer.

A ratio of the total amount of the metal in the charge auxiliary layer and the total amount of the oxide in the charge auxiliary layer may be a weight ratio of about 1:2 to about 1:5.

A thickness of the charge auxiliary layer may be less than or equal to about 5 nm.

The charge auxiliary layer may include a first charge auxiliary layer including the metal, and a second charge auxiliary layer including the oxide.

The first charge auxiliary layer may be in contact with the first electrode, and the second charge auxiliary layer may be in contact with the organic photoelectric conversion layer.

The first charge auxiliary layer may be in contact with the organic photoelectric conversion layer, and the second charge auxiliary layer is in contact with the first electrode.

The first charge auxiliary layer may be thicker than the second charge auxiliary layer.

A thickness of the first charge auxiliary layer may be about 2 to 8 times of a thickness of the second charge auxiliary layer.

The charge auxiliary layer may further include a third charge auxiliary layer, the third charge auxiliary layer including a mixture of the metal and the oxide.

The first electrode may be a cathode and the second electrode may be an anode.

An organic sensor may include the photoelectric conversion device.

The organic sensor may further include a semiconductor substrate, the semiconductor substrate stacked above or beneath the photoelectric conversion device.

The organic sensor may further include a photodiode, the photodiode being integrated in the semiconductor substrate.

An electronic device may include the organic sensor.

The organic photoelectric conversion layer may include at least one of an intrinsic layer including a bulk heterojunction of a p-type semiconductor and an n-type semiconductor, or a bi-layer including a p-type layer and an n-type layer, the p-type layer including a p-type semiconductor, the n-type layer including an n-type semiconductor.

According to some example embodiments, a photoelectric conversion device may include a first electrode and a second electrode facing each other, an organic photoelectric conversion layer between the first electrode and the second electrode, and a charge auxiliary layer between the first electrode and the organic photoelectric conversion layer. The organic photoelectric conversion layer may be configured to absorb light in at least a portion of a wavelength spectrum of incident light and to convert the absorbed light into an electrical signal. The charge auxiliary layer may include a metal and an oxide.

The oxide may be an oxide material that excludes silicon oxide such that the charge auxiliary layer does not include silicon oxide.

The oxide may have an energy bandgap of about 4.5 eV to about 7.5 eV.

The metal may include a lanthanide element, calcium (Ca), potassium (K), aluminum (Al), an alloy thereof, or a combination thereof.

The lanthanide element may include ytterbium (Yb).

The oxide may include germanium oxide, aluminum oxide, gallium oxide, selenium oxide, strontium oxide, lanthanum oxide, neodymium oxide, gadolinium oxide, ytterbium oxide, lutetium oxide, or a combination thereof.

The charge auxiliary layer may include a mixture of the metal and the oxide.

A total amount of the oxide in the charge auxiliary layer may be greater than a total amount of the metal in the charge auxiliary layer.

A ratio of the total amount of the metal in the charge auxiliary layer and the total amount of the oxide in the charge auxiliary layer may be a weight ratio of about 1:2 to about 1:5.

A thickness of the charge auxiliary layer may be between about 0.2 nm and about 5 nm.

The charge auxiliary layer may include a first charge auxiliary layer including the metal, and a second charge auxiliary layer including the oxide.

The photoelectric conversion layer may include at least one of an intrinsic layer including a bulk heterojunction of a p-type semiconductor and an n-type semiconductor, or a bi-layer including a p-type layer and an n-type layer, the p-type layer including a p-type semiconductor, the n-type layer including an n-type semiconductor.

The charge extraction efficiency of the photoelectric conversion device may be increased by improving charge mobility and reducing remaining charges.

DETAILED DESCRIPTION

Figure 1A:
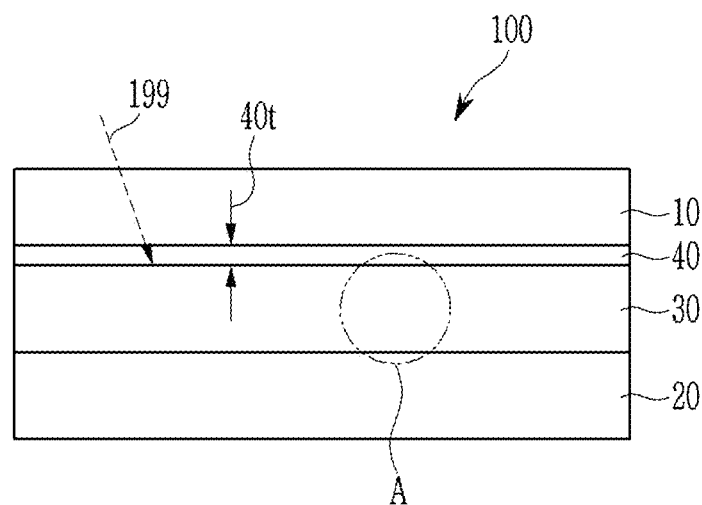
FIG. 1A is a cross-sectional view showing an example of a photoelectric conversion device according to some example embodiments.

Hereinafter, some example embodiments of the present disclosure will be described in detail so that a person skilled in the art would understand the same. However, this disclosure may be embodied in many different forms and is not to be construed as limited to the example embodiments set forth herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

As used herein, when a definition is not otherwise provided, "substituted" refers to replacement of a hydrogen atom of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, "hetero" refers to one including 1 to 4 heteroatoms selected from N, O, S, Se, Te, Si, and P.

Hereinafter, "combination" refers to a mixture of two or more and a stacked structure of two or more.

Hereinafter, a work function or an energy level is expressed as an absolute value from a vacuum level. In addition, when the work function or the energy level is referred to be deep, high, or large, it may have a large absolute value based on "0 eV" of the vacuum level while when the work function or the energy level is referred to be shallow, low, or small, it may have a small absolute value based on "0 eV" of the vacuum level.

Hereinafter, a photoelectric conversion device according to some example embodiments is described.

Figure 1B:
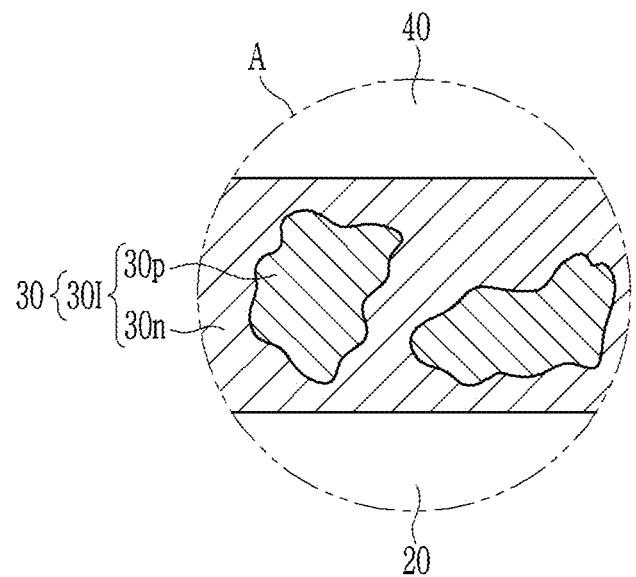
FIGS. 1B, 1C, and 1D are expanded views of region A of FIG. 1A according to some example embodiments.
Figure 1C:
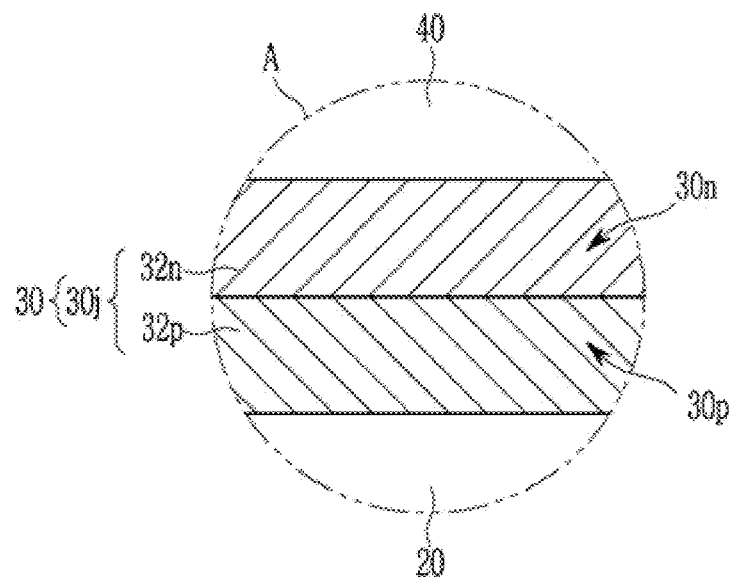
Figure 1D:
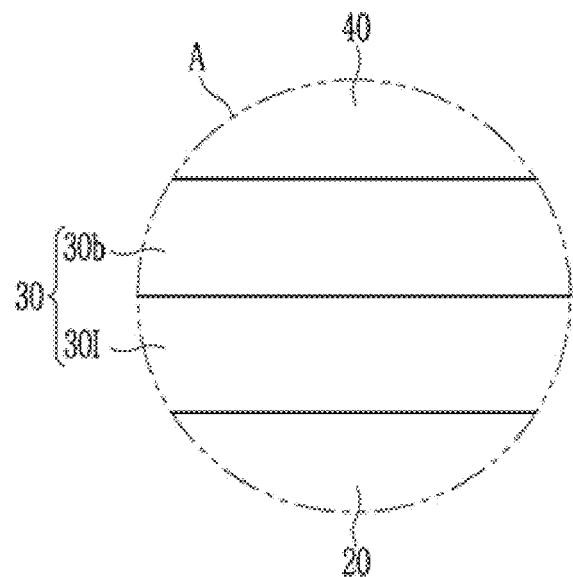

FIG. 1A is a cross-sectional view showing an example of a photoelectric conversion device according to some example embodiments. FIGS. 1B, 1C, and 1D are expanded views of region A of FIG. 1A according to some example embodiments.

Referring to FIG. 1A, a photoelectric conversion device 100 according to some example embodiments includes a first electrode 10, a second electrode 20, a photoelectric conversion layer 30 (also referred to as an organic photoelectric conversion layer), and a charge auxiliary layer 40. As shown in FIG. 1A, the first electrode 10 and the second electrode 20 are facing each other, and the photoelectric conversion layer 30 is between the first electrode 10 and the second electrode 20.

A substrate (not shown) may be disposed at the side of the first electrode 10 or the second electrode 20. In some example embodiments, the substrate is omitted from the photoelectric conversion device 100. The substrate may be for example made of an inorganic material such as glass; an organic material such as polycarbonate, polymethylmethacrylate, polyethyleneterephthalate, polyethylenenaphthalate, polyamide, polyethersulfone, or a combination thereof; or a silicon wafer. The substrate may be omitted.

One of the first electrode 10 or the second electrode 20 is an anode and the other is a cathode. For example, the first electrode 10 may be a cathode and the second electrode 20 may be an anode.

At least one of the first electrode 10 or the second electrode 20 may be a transparent electrode. Herein, the transparent electrode may have a high light transmittance of greater than or equal to about 80% and may not include for example a semi-transparent electrode for microcavity. The transparent electrode may include for example at least one of an oxide conductor or a carbon conductor. The oxide conductor may include for example at least one of indium tin oxide (ITO), indium zinc oxide (IZO), zinc tin oxide (ZTO), aluminum tin oxide (ATO), and aluminum zinc oxide (AZO) and the carbon conductor may at least one of graphene or carbon nanostructure.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

One of the first electrode 10 or the second electrode 20 may be a reflective electrode. Herein, the reflective electrode may have, for example, a light transmittance of less than about 10% or high reflectance of less than or equal to about 5%. The reflective electrode may include a reflective conductor such as a metal and may include, for example aluminum (Al), silver (Ag), gold (Au), or an alloy thereof.

For example, the first electrode 10 may be a transparent electrode having a light transmittance of greater than or equal to about 80% or a reflective electrode having a light transmittance of less than about 10%. For example, the first electrode 10 may be a transparent electrode having a light transmittance of greater than or equal to about 80%, and may be a light-receiving electrode.

The photoelectric conversion layer 30 may be configured to absorb light in at least one part in a wavelength spectrum of incident light 199 that is incident on the photoelectric conversion layer 30 (e.g., incident on one or more surfaces of the photoelectric conversion layer 30 through at least the first electrode 10 and/or the second electrode 20) and may be configured to convert the absorbed light into an electrical signal, and for example one of light in a green wavelength spectrum (hereinafter, referred to as "green light"), light in a blue wavelength spectrum (hereinafter, referred to as "blue light"), light in a red wavelength spectrum (hereinafter, referred to as "red light"), or light in an infrared wavelength spectrum (hereinafter, referred to as "infrared light") into an electrical signal.

For example, the photoelectric conversion layer 30 may be configured to selectively absorb at least one of the green light, the blue light, the red light, or the infrared light. Herein, the selective absorption of at least one from the green light, the blue light, the red light, and the infrared light means that an absorption spectrum has a peak absorption wavelength ($\lambda_{max}$) in one of about 500 nm to about 600 nm, greater than or equal to about 380 nm and less than about 500 nm, greater than about 600 nm and less than or equal to about 700 nm, or greater than about 700 nm, and an absorption spectrum in the corresponding wavelength spectrum is remarkably higher than those in the other wavelength spectrums.

The photoelectric conversion layer 30 may include at least one p-type semiconductor 30p and at least one n-type semiconductor 30n which collectively form (e.g., define, establish, etc.) a pn junction 31 and may produce excitons by receiving light from outside and then separate the produced excitons into holes and electrons. At least one of the p-type semiconductor 30p or the n-type semiconductor 30n may be an organic material, and thus the photoelectric conversion layer 30 may be an organic photoelectric conversion layer.

The p-type semiconductor 30p and the n-type semiconductor 30n may be independently light-absorbing materials, and for example at least one of the p-type semiconductor 30p or the n-type semiconductor 30n may be an organic light-absorbing material. For example, at least one of the p-type semiconductor 30p or the n-type semiconductor 30n may be a wavelength-selective light-absorbing material configured to selectively absorb light in a predetermined wavelength spectrum, and for example at least one of the p-type semiconductor 30p or the n-type semiconductor 30n may be a wavelength-selective organic light-absorbing material. The p-type semiconductor 30p and the n-type semiconductor 30n may have a peak absorption wavelength ($\lambda_{max}$) in the same wavelength spectrum or in a different wavelength spectrum.

For example, the p-type semiconductor 30p may be an organic material having a core structure including an electron donating moiety, a pi conjugation linking group, and an electron accepting moiety.

The p-type semiconductor 30p may be for example represented by Chemical Formula 1, but is not limited thereto.

EDG-HA-EAG     [Chemical Formula 1]

In Chemical Formula 1,

HA may be a pi conjugation linking group such as a C2 to C30 heterocyclic group having at least one of S, Se, Te, or Si, EDG may be an electron-donating moiety, and EAG may be an electron accepting moiety.

For example, the p-type semiconductor 30p represented by Chemical Formula 1 may be for example represented by Chemical Formula 1A.

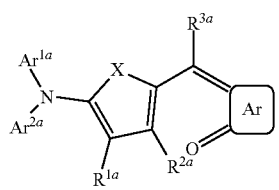

[Chemical Formula 1A]

In Chemical Formula 1A,

X may be S, Se, Te, SO, $SO_2$, or $SiR^aR^b$,

Ar may be a substituted or unsubstituted C6 to C30 arylene group, a substituted or unsubstituted C3 to C30 heterocyclic group, or a fused ring of the foregoing two or more, $Ar^{1a}$ and $Ar^{2a}$ may independently be a substituted or unsubstituted C6 to C30 aryl group or a substituted or unsubstituted C3 to C30 heteroaryl group, $Ar^{1a}$ and $Ar^{2a}$ may independently be present or may be linked to each other to form a fused ring, and $R^{1a}$ to $R^{1a}$, $R^a$, and $R^b$ may independently be hydrogen, deuterium, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, in Chemical Formula 1A, $Ar^{1a}$ and $Ar^{2a}$ may independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, or a substituted or unsubstituted pyridopyridazinyl group.

For example, $Ar^{1a}$ and $Ar^{2a}$ of Chemical Formula 1A may be linked to each other to form a ring or for example, $Ar^{1a}$ and $Ar^{2a}$ may be linked to each other by one of a single bond, —$(CR^gR^h)_{n2}$— (n2 is 1 or 2), —O—, —S—, —Se—, —N=, —$NR^i$—, —$SiR^jR^k$—, or —$GeR^lR^m$— to form a ring. Herein, $R^g$ to $R^m$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, the p-type semiconductor 30p represented by Chemical Formula 1 may be for example represented by Chemical Formula 1B.

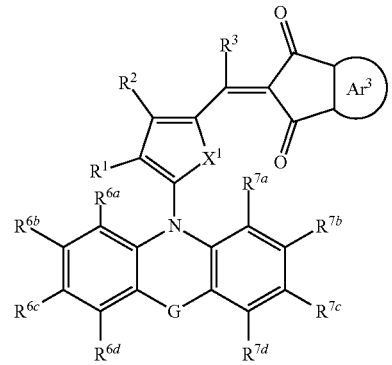

[Chemical Formula 1B]

In Chemical Formula 1B, $X^1$ may be Se, Te, O, S, SO, or $SO_2$, $Ar^3$ may be a substituted or unsubstituted C6 to C30 arylene group, a substituted or unsubstituted C3 to C30 heterocyclic group, or a fused ring of the foregoing two or more, $R^1$ to $R^3$ may independently be one of hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, a cyano-containing group, or a combination thereof, G may be one of a single bond, —O—, —S—, —Se—, —N=, —$(CR^fR^g)_k$—, —$NR^h$—, —$SiR^iR^j$—, —$GeR^kR^l$—, —$(C(R^m)=C(R^n))$—, or $SnR^oR^p$, wherein $R^f$, $R^g$, $R^h$, $R^i$, $R^j$, $R^k$, $R^l$, $R^m$, $R^n$, $R^o$, and $R^p$ may independently be one of hydrogen, a halogen, a substituted or unsubstituted C1 to C10 alkyl group, a substituted or unsubstituted C1 to C10 alkoxy group, and a substituted or unsubstituted C6 to C12 aryl group, $R^f$ and $R^g$, $R^i$ and $R^j$, $R^k$ and $R^l$, $R^m$ or $R^n$, and $R^o$ and $R^p$ may independently be present alone or may be linked to each other to provide a ring, and k may be 1 or 2, $R^{6a}$ to $R^{6d}$ and $R^{7a}$ to $R^{7d}$ may independently be one of hydrogen, a substituted or unsubstituted C1 to C30 alkyl group, a substituted or unsubstituted C6 to C30 aryl group, a substituted or unsubstituted C3 to C30 heteroaryl group, a halogen, a cyano group, a cyano-containing group, or a combination thereof, $R^{6a}$ to $R^{6d}$ may independently be present alone or adjacent two thereof may be linked to each other to form a fused ring, and $R^{7a}$ to $R^{7d}$ may independently be present alone or adjacent two thereof may be linked to each other to form a fused ring.

For example, $Ar^3$ of Chemical Formula 1B may be benzene, naphthylene, anthracene, thiophene, selenophene, tellurophene, pyridine, pyrimidine, or a fused ring of the foregoing two or more.

The n-type semiconductor 30n may be for example fullerene or a fullerene derivative, but is not limited thereto.

As shown in FIG. 1B, the photoelectric conversion layer 30 may be an intrinsic layer 30l (an l layer) wherein the p-type semiconductor 30p and the n-type semiconductor 30n are blended as a bulk heterojunction to form the pn junction 31. Restated, the photoelectric conversion layer 30 may include an intrinsic layer 30l that includes a bulk heterojunction of the p-type semiconductor 30p and the n-type semiconductor 30n. Herein, the p-type semiconductor 30p and the n-type semiconductor 30n may be blended in a volume ratio of about 1:9 to about 9:1, for example about 2:8 to about 8:2, about 3:7 to about 7:3, about 4:6 to about 6:4, or about 5:5.

As shown in FIG. 1C, the photoelectric conversion layer 30 may include a bi-layer 30j including a p-type layer 32p including the aforementioned p-type semiconductor 30p and an n-type layer 32n including the aforementioned n-type semiconductor 30n. Herein, a thickness ratio of the p-type layer 32p and the n-type layer 32n may be about 1:9 to about 9:1, for example about 2:8 to about 8:2, about 3:7 to about 7:3, about 4:6 to about 6:4, or about 5:5.

As shown in FIG. 1D, the photoelectric conversion layer 30 may further include a p-type layer 32p and/or an n-type layer 32n in addition to the intrinsic layer 30l. The p-type layer 32p may include the aforementioned p-type semiconductor 30p and exclude the n-type semiconductor 30n and the n-type layer 32n may include the aforementioned n-type semiconductor 30n and exclude the aforementioned p-type semiconductor 30p. For example, they may be included in various combinations of p-type layer 32p/l layer, l layer/n-type layer 32n, p-type layer 32p/l layer/n-type layer 32n, and the like.

The charge auxiliary layer 40 may be between the first electrode 10 and the photoelectric conversion layer 30 and may be for example in contact with the photoelectric conversion layer 30 (e.g., directly on the photoelectric conversion layer 30). For example, as shown in FIG. 1A, one surface of the charge auxiliary layer 40 may be in contact with the first electrode 10 and the other surface (e.g., opposite surface) of the charge auxiliary layer 40 may be in contact with the photoelectric conversion layer 30, such that the charge auxiliary layer 40 may be understood to be directly between the first electrode 10 and the photoelectric conversion layer 30.

The charge auxiliary layer 40 is a layer for effectively improving the extraction of charges (e.g., electrons or holes) moving from the photoelectric conversion layer 30 to the first electrode 10, such that a photoelectric conversion device 100 having the charge auxiliary layer 40 may have improved photoelectric conversion performance. The charge auxiliary layer 40 may be, for example, an electron transport layer or a hole transport layer. For example, the charge auxiliary layer 40 may be an electron transport layer.

The charge auxiliary layer 40 may include a material that has the aforementioned charge transport characteristics and may be formed by thermal evaporation. As such, the charge auxiliary layer 40 is formed by thermal evaporation, thereby reducing or preventing the photoelectric conversion layer 30 from being thermally physically damaged in the formation and/or subsequent processes of the charge auxiliary layer 40 and thus reducing or preventing performance degradation due to deterioration of the photoelectric conversion layer 30.

For example, the charge auxiliary layer 40 may include two or more materials, for example, two or more inorganic materials. For example, the charge auxiliary layer 40 may include a metal and an oxide (except for silicon oxide), and may include a mixture of the metal and the oxide. Restated, the aforementioned oxide may be an oxide material that is not, does not include, and/or excludes silicon oxide such that the charge auxiliary layer 40 does not include silicon oxide. In some example embodiments, the aforementioned oxide may be any oxide material, including silicon oxide, such that, in some example embodiments, the charge auxiliary layer 40 may include silicon oxide.

The metal included in the charge auxiliary layer 40 may, for example, have a lower work function than a work function of the first electrode 10. For example, the work function of the metal included in the charge auxiliary layer 40 may be less than a work function of the first electrode 10 by greater than or equal to about 0.5 eV. For example, the work function of the first electrode 10 may be greater than or equal to about 4.5 eV, and the work function of the metal included in the charge auxiliary layer 40 may be less than or equal to about 4.0 eV. For example, the work function of the first electrode 10 may be greater than or equal to about 4.5 eV and the work function of the metal included in the charge auxiliary layer 40 may be less than or equal to about 3.5 eV, less than or equal to about 3.0 eV, or less than or equal to about 2.8 eV. For example, the work function of the first electrode 10 may be about 4.5 eV to about 5.0 eV and the work function of the charge auxiliary layer 40 may be about 1.5 eV to about 4.0 eV, about 1.5 eV to about 3.5 eV, about 1.5 eV to about 3.0 eV, or about 1.5 eV to about 2.8 eV. The metal included in the charge auxiliary layer 40 may include one or more types.

The metal included in the charge auxiliary layer 40 may include, for example, a lanthanide element, calcium (Ca), potassium (K), aluminum (Al), an alloy thereof, or a combination thereof. The lanthanide element may include, for example, ytterbium (Yb).

The oxide (e.g., "oxide material") included in the charge auxiliary layer 40 may be a metal oxide and/or a metalloid oxide, and may be selected from an oxide having an energy band gap of about 4.5 eV to about 7.5 eV. The oxide included in the charge auxiliary layer 40 may include one or more types.

The oxide included in the charge auxiliary layer 40 may include, for example, germanium oxide such as $GeO_2$, aluminum oxide such as $Al_2O_3$, gallium oxide such as $Ga_2O_3$, selenium oxide such as $Se_2O_3$, strontium oxide such as SrO, lanthanum oxide such as $La_2O_3$, neodymium oxide such as $Nd_2O_3$, gadolinium oxide such as $Gd_2O_3$, ytterbium oxide such as $Yb_2O_3$, lutetium oxide such as $Lu_2O_3$, or a combination thereof.

The charge auxiliary layer 40 may include a mixture (e.g., homogenous mixture, heterogeneous mixture, or any combination thereof) of a metal (including any of the metals that may be included in the charge auxiliary layer 40 according to any example embodiments) and an oxide (including any of the oxides that may be included in the charge auxiliary layer 40 according to any example embodiments), for example, an oxide may be included in a larger amount (e.g., mass or weight) than the metal. Restated, a total amount (e.g., total mass and/or total weight) of the oxide in the charge auxiliary layer 40 may be greater than a total amount (e.g., total mass and/or total weight) of the metal in the charge auxiliary layer 40. For example, the metal and the oxide may be included in a weight ratio (e.g., a ratio of the total amount of the metal in the charge auxiliary layer and the total amount of the oxide in the amount of the oxide in the charge auxiliary layer) of about 1:2 to about 1:10, about 1:2 to about 1:8, about 1:2 to about 1:7, or about 1:2 to about 1:5.

The charge auxiliary layer 40 may be thinner than the photoelectric conversion layer 30, for example, may have a thickness 40t of less than or equal to about 10 nm. Within the range, the charge auxiliary layer 40 may have a thickness 40t of greater than or equal to about 0.2 nm, wherein the thickness 40t is less than or equal to about 8 nm, less than or equal to about 7 nm, less than or equal to about 5 nm, less than or equal to about 3 nm, less than or equal to about 2 nm, or less than or equal to about 1 nm. Within the range, the thickness 40t of the charge auxiliary layer 40 may be about 0.2 nm to about 10 nm, about 0.2 nm to about 8 nm, about 0.2 nm to about 7 nm, about 0.2 nm to about 5 nm, about 0.5 nm to about 8 nm, about 0.5 nm to about 7 nm, about 0.5 nm to about 5 nm, about 1 nm to about 8 nm, about 1 nm to about 7 nm, about 1 nm to about 5 nm, about 0.2 nm to about 3 nm, about 0.2 nm to about 2 nm, or about 0.2 nm to about 1 nm.

As described above, the photoelectric conversion device 100 includes the charge auxiliary layer 40 between the first electrode 10 and the photoelectric conversion layer 30, so that extraction of charges (e.g., electrons) transferred from the photoelectric conversion layer 30 to the first electrode 10 may be effectively increased to reduce remaining charge carriers and to exhibit high charge extraction efficiency. Accordingly, it is possible to enhance the photoelectric conversion efficiency of the photoelectric conversion device 100 and to reduce an image lag which may be caused by remaining charge carriers based on including the charge auxiliary layer 40, thereby effectively improving the after-image (image sticking) characteristics.

The photoelectric conversion device 100 may further include an anti-reflection layer (not shown) on the first electrode 10 or the second electrode 20. The anti-reflection layer may be disposed at a light incidence side and lowers reflectance of light of incident light and thereby light absorbance may further improved. For example, when light is incident to the first electrode 10, the anti-reflection layer may be disposed on the first electrode 10, and when light is incident to the second electrode 20, the anti-reflection layer may be disposed on the second electrode 20.

The anti-reflection layer may include, for example a material having a refractive index of about 1.6 to about 2.5, and may include for example at least one of metal oxide, metal sulfide, or an organic material having a refractive index within the ranges. The anti-reflection layer may include, for example a metal oxide such as aluminum-containing oxide, molybdenum-containing oxide, tungsten-containing oxide, vanadium-containing oxide, rhenium-containing oxide, niobium-containing oxide, tantalum-containing oxide, titanium-containing oxide, nickel-containing oxide, copper-containing oxide, cobalt-containing oxide, manganese-containing oxide, chromium-containing oxide, tellurium-containing oxide, or a combination thereof; metal sulfide such as zinc sulfide; or an organic material such as an amine derivative, but is not limited thereto.

In the photoelectric conversion device 100, when light enters through the first electrode 10 or the second electrode 20 and the photoelectric conversion layer 30 absorbs light in a predetermined wavelength spectrum, excitons may be produced thereinside. The excitons are separated into holes and electrons in the photoelectric conversion layer 30, and the separated holes are transported to an anode that is one of the first electrode 10 or the second electrode 20 and the separated electrons are transported to the cathode that is the other of the first electrode 10 and the second electrode 20 so as to flow a current.

Hereinafter, a photoelectric conversion device according to some example embodiments is described.

Figure 2:
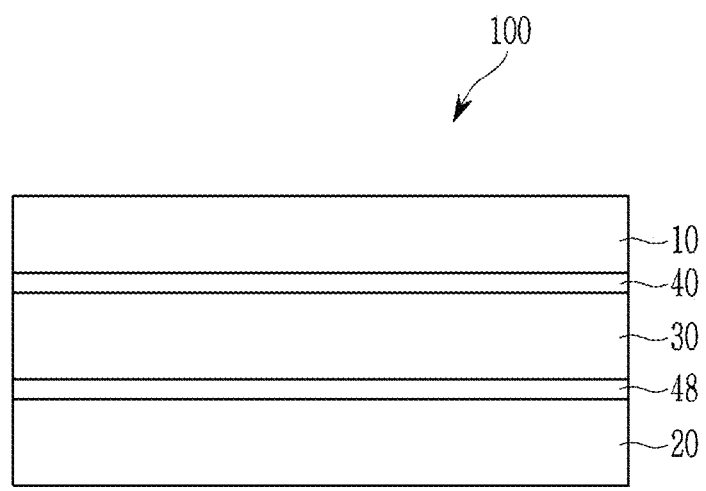
FIG. 2 is a cross-sectional view showing an example of a photoelectric conversion device according to some example embodiments.

FIG. 2 is a cross-sectional view showing an example of a photoelectric conversion device according to some example embodiments.

Referring to FIG. 2, a photoelectric conversion device 100 according to some example embodiments includes a first electrode 10, a second electrode 20, a photoelectric conversion layer 30, and a charge auxiliary layer 40, like some example embodiments.

However, the photoelectric conversion device 100 according to some example embodiments further includes a charge blocking layer 48 between the second electrode 20 and the photoelectric conversion layer 30, unlike some example embodiments. The charge blocking layer 48 may enhance photoelectric conversion efficiency by blocking charges (e.g., electrons) separated from the photoelectric conversion layer 30 from moving to the opposed electrode.

The charge blocking layer 48 may include, for example, an organic material, an inorganic material, or an organic/inorganic material. The organic material may include a monomer, an oligomer and/or a polymer having hole or electron characteristics and the inorganic material may include, for example a metal oxide such as molybdenum oxide, tungsten oxide, or nickel oxide.

The charge blocking layer 48 may include, for example an organic material represented by Chemical Formula 4A or 4B, but is not limited thereto.

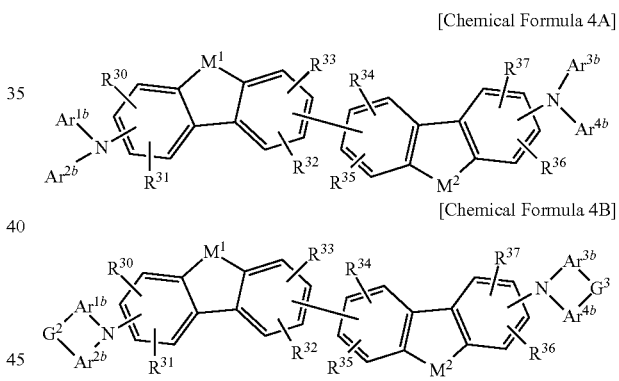

[Chemical Formula 4A]

[Chemical Formula 4B]

In Chemical Formula 4A or 4B, $M^1$ and $M^2$ are independently $CR''R^o$, $SiR^pR^q$, $NR^r$, O, S, Se, or Te, $Ar^{1b}$, $Ar^{2b}$, $Ar^{3b}$, and $Ar^{4b}$ are independently a substituted or unsubstituted C6 to C30 aryl group or a substituted or unsubstituted C3 to C30 heteroaryl group, $G^2$ and $G^3$ may independently be a single bond, —$(CR^sR^t)_{n3}$—, —O—, —S—, —Se—, —N=, —$NR^u$—, 'Si$R'R^w$—, or —Ge$R^xR^y$—, wherein n3 is 1 or 2, and $R^{30}$ to $R^{37}$ and $R''$ to $R^y$ are independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

For example, the compound represented by Formula 4A may be, for example, a compound represented by Formula 4A-1, and the compound represented by Formula 4B may be, for example, a compound represented by Formula 4B-1, but are not limited thereto.

[Chemical Formula 4A-1]

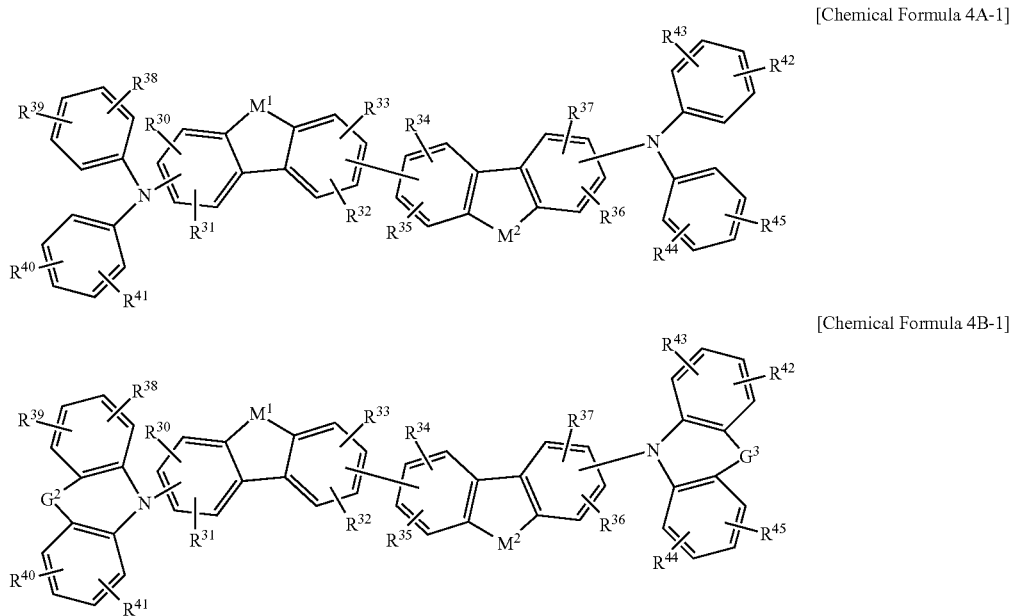

[Chemical Formula 4B-1]

In Chemical Formula 4A-1 or 4B-1, $M^1$, $M^2$, $G^2$, $G^3$, and $R^{30}$ to $R^{37}$ are the same as described above, and

[Chemical Formula 4A-1a]

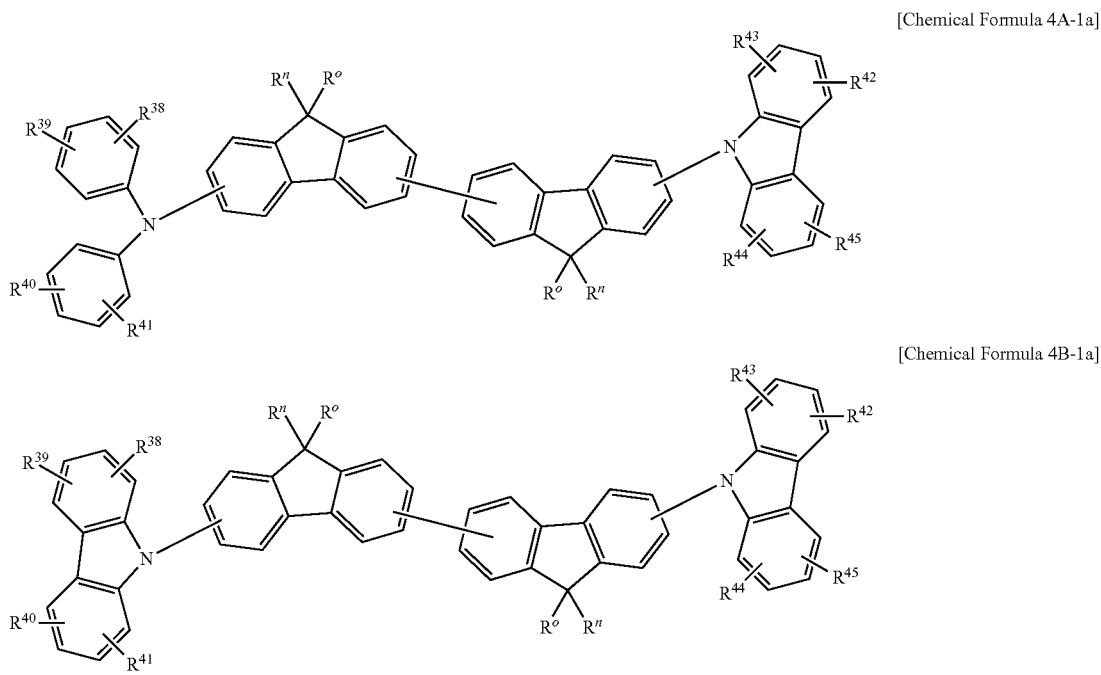

[Chemical Formula 4B-1a]

$R^{38}$ to $R^{45}$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, the compound represented by Chemical Formula 4A-1 may be, for example, a compound represented by Chemical Formula 4A-1a, and the compound represented by Chemical Formula 4B-1 may be, for example, a compound represented by Chemical Formula 4B-1a, but are not limited thereto.

In Chemical Formula 4A-1a or 4B1a, $R^{38}$ to $R^{45}$, $R^o$, and $R^n$ are the same as described above.

The photoelectric conversion device 100 according to some example embodiments further includes the charge blocking layer 48 between the second electrode 20 and the photoelectric conversion layer 30 in addition to the charge auxiliary layer 40 between the first electrode 10 and the photoelectric conversion layer 30, and thereby holes and electrons separated from the photoelectric conversion layer 30 may be transferred to each anode and cathode efficiently to further increase charge extraction efficiency.

Figure 3:
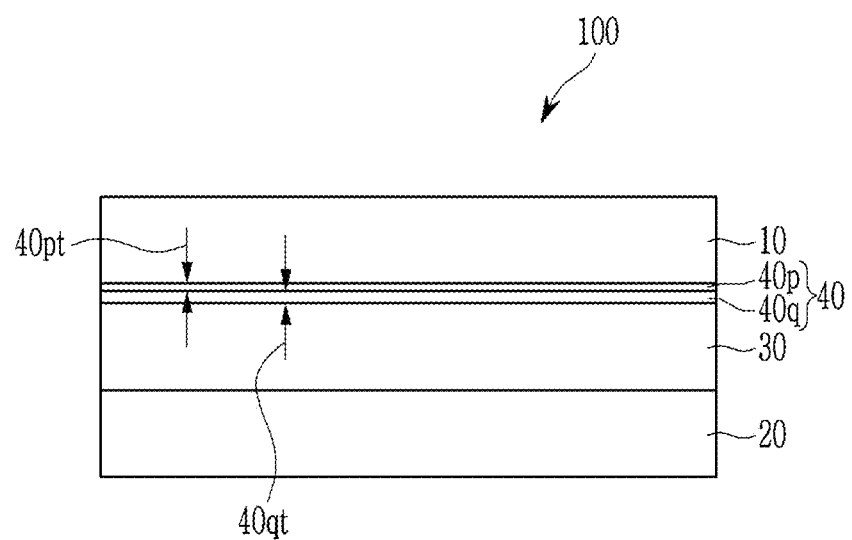
FIG. 3 is a cross-sectional view illustrating an example of a photoelectric conversion device according to some example embodiments.

FIG. 3 is a cross-sectional view showing an example of a photoelectric conversion device according to some example embodiments.

Referring to FIG. 3, a photoelectric conversion device 100 according to some example embodiments includes a first electrode 10, a second electrode 20, a photoelectric conversion layer 30, and a charge auxiliary layer 40, like some example embodiments. The detailed description is the same as described above.

However, in the photoelectric conversion device 100 according to some example embodiments, unlike some example embodiments, the charge auxiliary layer 40 includes the first charge auxiliary layer 40p and the second charge auxiliary layer 40q. The first charge auxiliary layer 40p may be disposed close to the first electrode 10 (e.g., proximate to the first electrode 10 in relation to the second charge auxiliary layer 40q, distal to the photoelectric conversion layer 30 in relation to the second charge auxiliary layer 40q), and the second charge auxiliary layer 40q may be disposed close to the photoelectric conversion layer 30 (e.g., distal to the first electrode 10 in relation to the first charge auxiliary layer 40p, proximate to the photoelectric conversion layer 30 in relation to the first charge auxiliary layer 40p). For example, the first charge auxiliary layer 40p may be in contact with the first electrode 10, and the second charge auxiliary layer 40q may be in contact with the photoelectric conversion layer 30. For example, the first charge auxiliary layer 40p and the second charge auxiliary layer 40q may be in contact with each other.

The first charge auxiliary layer 40p and the second charge auxiliary layer 40q may include different materials, for example, different inorganic materials. Restated, the first charge auxiliary layer 40p and the second charge auxiliary layer 40q may have different total material compositions. For example, the first charge auxiliary layer 40p may include a metal, which may be the metal of the charge auxiliary layer 40 as described herein, and the second charge auxiliary layer 40q may include an oxide, which may be the oxide of the charge auxiliary layer 40 as described herein. The first charge auxiliary layer 40p that includes a metal may not include any oxide, and the second charge auxiliary layer 40q that includes an oxide may not include any metal.

The metal included in the first charge auxiliary layer 40p is the same as described above, and may include, for example, a lanthanide element, calcium (Ca), potassium (K), aluminum (Al), or an alloy thereof. The lanthanide element may include, for example, ytterbium (Yb).

The oxide included in the second charge auxiliary layer 40q is the same as described above, and may include, for example germanium oxide such as $GeO_2$, aluminum oxide such as $Al_2O_3$, gallium oxide such as $Ga_2O_3$, selenium oxide such as $Se_2O_3$, strontium oxide such as SrO, lanthanum oxide such as $La_2O_3$, neodymium oxide such as $Nd_2O_3$, gadolinium oxide such as $Gd_2O_3$, ytterbium oxide such as $Yb_2O_3$, lutetium oxide such as $Lu_2O_3$, or a combination thereof.

The first charge auxiliary layer 40p including the metal may be thicker than the second charge auxiliary layer 40q including the oxide. Restated, a thickness 40pt of the first charge auxiliary layer 40p may be greater than a thickness 40qt of the second charge auxiliary layer 40q. For example, the thickness 40pt of the first charge auxiliary layer 40p may be about 2 to 10 times of the thickness 40qt of the second charge auxiliary layer 40q. Within the range, the thickness 40pt of the first charge auxiliary layer 40p may be about 2 to 9 times, about 2 to 8 times, about 2 to 6 times, about 2 to 5 times, or about 2 to 4 times of the thickness 40qt of the second charge auxiliary layer 40q.

Each thickness 40pt and 40qt of the first charge auxiliary layer 40p and the second charge auxiliary layer 40q, respectively, may independently be less than or equal to about 10 nm, less than or equal to about 8 nm, less than or equal to about 7 nm, less than or equal to about 5 nm, less than or equal to about 3 nm, less than or equal to about 2 nm, or less than or equal to about 1 nm. For example, each thickness 40pt and 40qt of the first charge auxiliary layer 40p and the second charge auxiliary layer 40q, respectively, may be about 0.2 nm to about 10 nm, about 0.2 nm to about 8 nm, about 0.2 nm to about 7 nm, about 0.2 nm to about 5 nm, about 0.2 nm to about 3 nm, about 0.2 nm to about 2 nm, or about 0.2 nm to about 1 nm.

Figure 4:
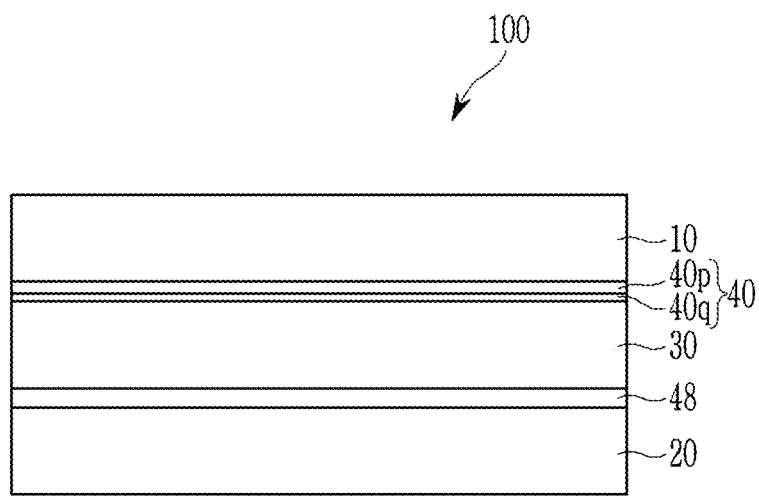
FIG. 4 is a cross-sectional view illustrating an example of a photoelectric conversion device according to some example embodiments.

FIG. 4 is a cross-sectional view showing an example of a photoelectric conversion device according to some example embodiments.

Referring to FIG. 4, a photoelectric conversion device 100 according to some example embodiments includes a first electrode 10, a second electrode 20, a photoelectric conversion layer 30, a first charge auxiliary layer 40p, and a second charge auxiliary layer 40q, like some example embodiments.

However, the photoelectric conversion device 100 according to some example embodiments further includes a charge blocking layer 48 between the second electrode 20 and the photoelectric conversion layer 30, unlike some example embodiments. The charge blocking layer 48 may enhance photoelectric conversion efficiency by blocking charges (e.g., electrons) separated from the photoelectric conversion layer 30 from moving to the opposed electrode and details thereof are the same as described above.

Figure 5:
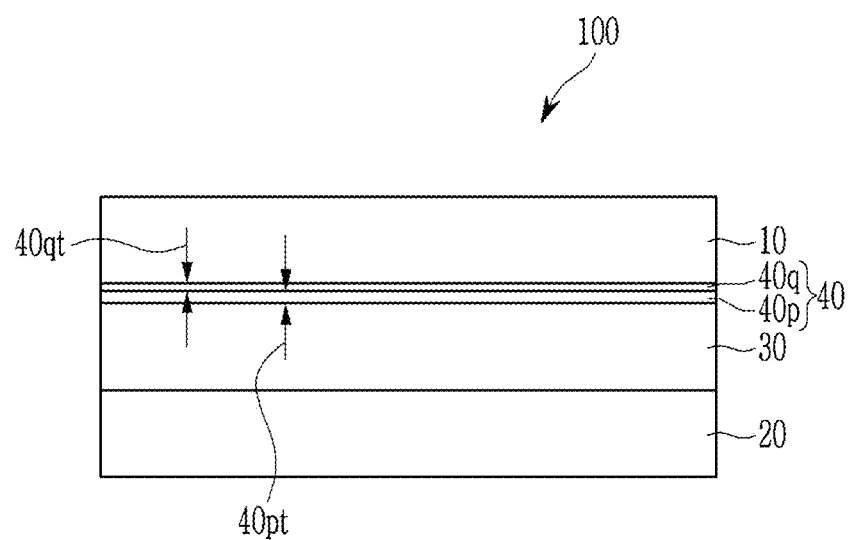
FIG. 5 is a cross-sectional view illustrating an example of a photoelectric conversion device according to some example embodiments.

FIG. 5 is a cross-sectional view illustrating an example of a photoelectric conversion device according to some example embodiments.

Referring to FIG. 5, the photoelectric conversion device 100 according to some example embodiments may include a first electrode 10, a second electrode 20; a photoelectric conversion layer 30; and a charge auxiliary layer 40 including a first charge auxiliary layer 40p and a second charge auxiliary layer 40q, like, for example, some example embodiments shown in FIGS. 3-4. The detailed description is the same as described above.

However, in the photoelectric conversion device 100 according to some example embodiments, the positions of the first charge auxiliary layer 40p and the second charge auxiliary layer 40q are different, unlike, for example, some example embodiments shown in FIG. 3. That is, the first charge auxiliary layer 40p including the metal is disposed close (proximate) to the photoelectric conversion layer 30 in relation to the second charge auxiliary layer 40q, and the second charge auxiliary layer 40q including the oxide is disposed close (proximate) to the first electrode 10 in relation to the first charge auxiliary layer 40p. For example, the first charge auxiliary layer 40p may be in contact with the photoelectric conversion layer 30, and the second charge auxiliary layer 40q may be in contact with the first electrode 10. For example, the first charge auxiliary layer 40p and the second charge auxiliary layer 40q may be in contact with each other.

The metal included in the first charge auxiliary layer 40p is the same as described above, and may include, for example, a lanthanide element, calcium (Ca), potassium (K), aluminum (Al), or an alloy thereof. The lanthanide element may include, for example, ytterbium (Yb).

The oxide included in the second charge auxiliary layer 40$q$ is the same as described above and may include, for example, germanium oxide such as $GeO_2$, aluminum oxide such as $Al_2O_3$, gallium oxide such as $Ga_2O_3$, selenium oxide such as $Se_2O_3$, strontium oxide such as SrO, lanthanum oxide such as $La_2O_3$, neodymium oxide such as $Nd_2O_3$, gadolinium oxide such as $Gd_2O_3$, ytterbium oxide such as $Yb_2O_3$, lutetium oxide such as $Lu_2O_3$, or a combination thereof.

The first charge auxiliary layer 40$p$ including the metal may be thicker than the second charge auxiliary layer 40$q$ including the oxide. Restated, a thickness 40$pt$ of the first charge auxiliary layer 40$p$ may be greater than a thickness 40$qt$ of the second charge auxiliary layer 40$q$. For example, the thickness 40$pt$ of the first charge auxiliary layer 40$p$ may be about 2 to 10 times of the thickness 40$qt$ of the second charge auxiliary layer 40$q$. Within the range, the thickness 40$pt$ of the first charge auxiliary layer 40$p$ may be about 2 to 9 times, about 2 to 8 times, about 2 to 6 times, about 2 to 5 times, or about 2 to 4 times of the thickness 40$qt$ of the second charge auxiliary layer 40$q$.

Each thickness 40$pt$ and 40$qt$ of the first charge auxiliary layer 40$p$ and the second charge auxiliary layer 40$q$, respectively, may independently be less than or equal to about 10 nm, less than or equal to about 8 nm, less than or equal to about 7 nm, less than or equal to about 5 nm, less than or equal to about 3 nm, or less than or equal to about 2 nm. For example, each thickness 40$pt$ and 40$qt$ of the first charge auxiliary layer 40$p$ and the second charge auxiliary layer 40$q$, respectively, may be about 0.2 nm to about 10 nm, within the range, about 0.2 nm to about 8 nm, about 0.2 nm to about 7 nm, about 0.2 nm to about 5 nm, about 0.2 nm to about 3 nm, about 0.2 nm to about 2 nm, or about 0.2 nm to about 1 nm.

Figure 6:
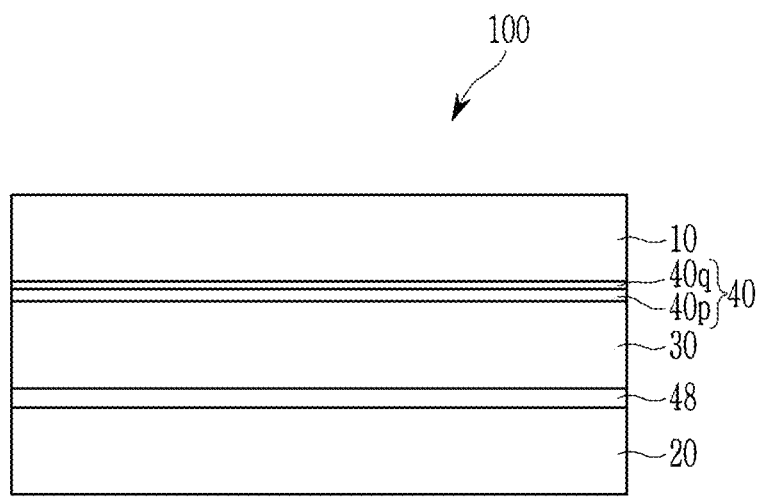
FIG. 6 is a cross-sectional view illustrating an example of a photoelectric conversion device according to some example embodiments.

FIG. 6 is a cross-sectional view illustrating an example of a photoelectric conversion device according to some example embodiments.

Referring to FIG. 6, the photoelectric conversion device 100 according to some example embodiments may include a first electrode 10; a second electrode 20; a photoelectric conversion layer 30; and a charge auxiliary layer 40 including a first charge auxiliary layer 40$p$ and a second charge auxiliary layer 40$q$, like some example embodiments. The detailed description is the same as described above.

However, the photoelectric conversion device 100 according to some example embodiments further includes a charge blocking layer 48 between the second electrode 20 and the photoelectric conversion layer 30, unlike some example embodiments. The charge blocking layer 48 may increase photoelectric conversion efficiency by blocking charges (e.g., electrons) separated from the photoelectric conversion layer 30 from moving to the opposite electrode (e.g., the second electrode). The detailed description is the same as described above.

Figure 7:
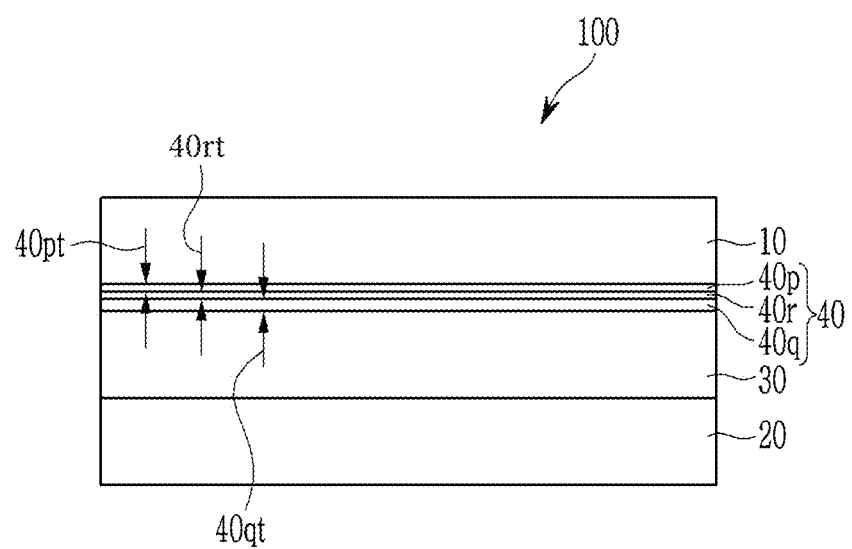
FIG. 7 is a cross-sectional view illustrating an example of a photoelectric conversion device according to some example embodiments.

FIG. 7 is a cross-sectional view illustrating an example of a photoelectric conversion device according to some example embodiments.

Referring to FIG. 7, the photoelectric conversion device 100 according to some example embodiments may include a first electrode 10, a second electrode 20; a photoelectric conversion layer 30; and a charge auxiliary layer 40 including a first charge auxiliary layer 40$p$ and a second charge auxiliary layer 40$q$, like some example embodiments, for example the example embodiments shown in FIG. 3. The detailed description is the same as described above.

However, in the photoelectric conversion device 100 according to some example embodiments, the charge auxiliary layer 40 further includes a third charge auxiliary layer 40$r$, unlike some example embodiments, for example the example embodiments shown in FIG. 3. As shown, the third charge auxiliary layer 40$r$ may be between the first and second charge auxiliary layer 40$p$ and 40$q$.

The third charge auxiliary layer 40$r$, which may be a separate, discrete layer in relation to the first and second charge auxiliary layers 40$p$ and 40$q$, may include a mixture of a metal and an oxide, and for example, may include a mixture of the metal included in the first charge auxiliary layer 40$p$ and the oxide included in the second charge auxiliary layer 40$q$.

The metal included in the first charge auxiliary layer 40$p$ is the same as described above, and may include, for example, a lanthanide element, calcium (Ca), potassium (K), aluminum (Al), or an alloy thereof. The lanthanide element may include, for example, ytterbium (Yb).

The oxide included in the second charge auxiliary layer 40$q$ is the same as described above and may include, for example, germanium oxide such as $GeO_2$, aluminum oxide such as $Al_2O_3$, gallium oxide such as $Ga_2O_3$, selenium oxide such as $Se_2O_3$, strontium oxide such as SrO, lanthanum oxide such as $La_2O_3$, neodymium oxide such as $Nd_2O_3$, gadolinium oxide such as $Gd_2O_3$, ytterbium oxide such as $Yb_2O_3$, lutetium oxide such as $Lu_2O_3$, or a combination thereof.

The third charge auxiliary layer 40$r$ may include, for example, a mixture of a metal selected from a lanthanide element, calcium (Ca), potassium (K), aluminum (Al), an alloy thereof, or a combination thereof and an oxide selected from germanium oxide such as $GeO_2$, aluminum oxide such as $Al_2O_3$, gallium oxide such as $Ga_2O_3$, selenium oxide such as $Se_2O_3$, strontium oxide such as SrO, lanthanum oxide such as $La_2O_3$, neodymium oxide such as $Nd_2O_3$, gadolinium oxide such as $Gd_2O_3$, ytterbium oxide such as $Yb_2O_3$, lutetium oxide such as $Lu_2O_3$, or a combination thereof.

The metal and the oxide included in the third charge auxiliary layer 40$r$ may be included in a weight ratio of about 1:9 to about 9:1, and may be about 2:8 to about 8:2, about 3:7 to about 7:3, or about 4:6 to about 6:4.

Each thickness 40$pt$, 40$qt$, and 40$rt$ of the first charge auxiliary layer 40$p$, the second charge auxiliary layer 40$q$, and the third charge auxiliary layer 40$r$, respectively, may independently be less than or equal to about 10 nm, less than or equal to about 8 nm, less than or equal to about 7 nm, less than or equal to about 5 nm, less than or equal to about 3 nm, or less than or equal to about 2 nm. For example, each thickness 40$pt$, 40$qt$, and 40$rt$ of the first charge auxiliary layer 40$p$, the second charge auxiliary layer 40$q$, and the third charge auxiliary layer 40$r$, respectively, may be about 0.2 nm to about 10 nm, within the range, about 0.2 nm to about 8 nm, about 0.2 nm to about 7 nm, about 0.2 nm to about 5 nm, about 0.2 nm to about 3 nm, about 0.2 nm to about 2 nm, or about 0.2 nm to about 1 nm.

In the drawing, an example in which the third charge auxiliary layer 40$r$ is disposed between the first charge auxiliary layer 40$p$ and the second charge auxiliary layer 40$q$ is illustrated. However, the third charge auxiliary layer 40$r$ is not limited thereto and may be disposed between the first electrode 10 and the first charge auxiliary layer 40$p$ or between the photoelectric conversion layer 30 and the second charge auxiliary layer 40$q$.

Figure 8:
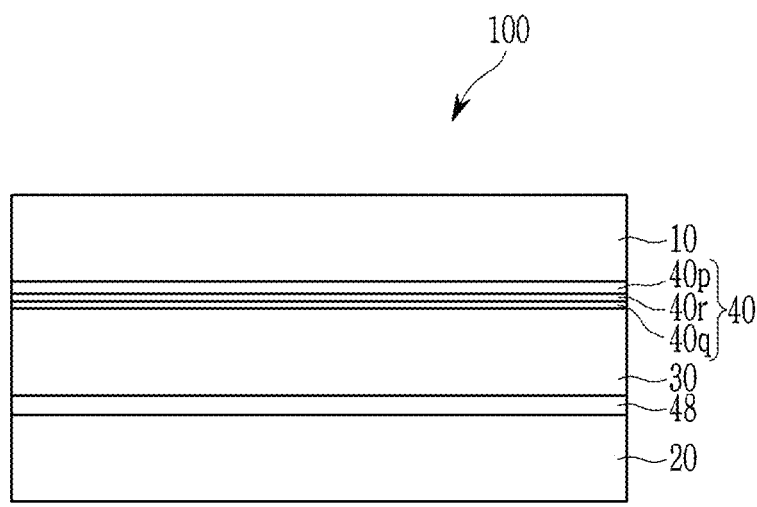
FIG. 8 is a cross-sectional view illustrating an example of a photoelectric conversion device according to some example embodiments.

FIG. 8 is a cross-sectional view illustrating an example of a photoelectric conversion device according to some example embodiments.

Referring to FIG. 8, the photoelectric conversion device 100 according to some example embodiments may include a first electrode 10; a second electrode 20; a photoelectric conversion layer 30; and a charge auxiliary layer 40 including a first charge auxiliary layer 40p, a second charge auxiliary layer 40q, and a third charge auxiliary layer 40r, like some example embodiments. The detailed description is the same as described above.

However, the photoelectric conversion device 100 according to some example embodiments further includes a charge blocking layer 48 between the second electrode 20 and the photoelectric conversion layer 30, unlike some example embodiments. The charge blocking layer 48 may enhance photoelectric conversion efficiency by blocking charges (e.g., electrons) separated from the photoelectric conversion layer 30 from moving to the opposed electrode and details thereof are the same as described above.

Figure 9:
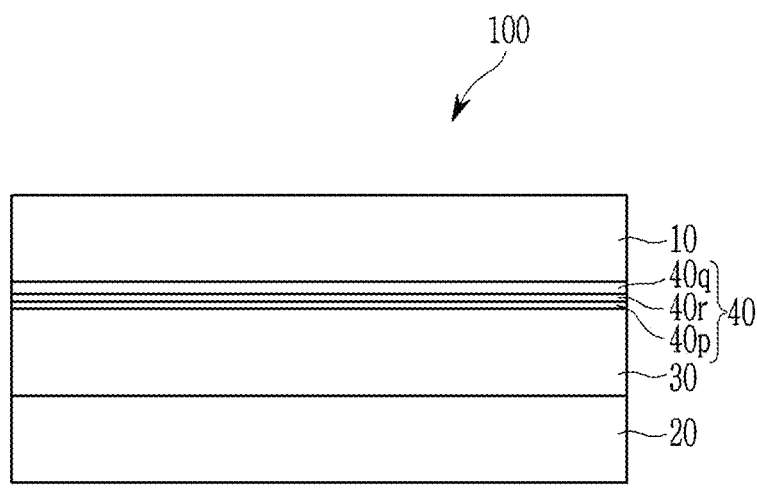
FIG. 9 is a cross-sectional view illustrating an example of a photoelectric conversion device according to some example embodiments.

FIG. 9 is a cross-sectional view illustrating an example of a photoelectric conversion device according to some example embodiments.

Referring to FIG. 9, the photoelectric conversion device 100 according to some example embodiments may include a first electrode 10; a second electrode 20; a photoelectric conversion layer 30; and a charge auxiliary layer 40 including a first charge auxiliary layer 40p, a second charge auxiliary layer 40q, and a third charge auxiliary layer 40r, like some example embodiments.

However, in the photoelectric conversion device 100 according to some example embodiments, the positions of the first charge auxiliary layer 40p and the second charge auxiliary layer 40q are different. That is, the first charge auxiliary layer 40p including the metal is disposed close to the photoelectric conversion layer 30, the second charge auxiliary layer 40q including the oxide is disposed close to the first electrode 10, and the third charge auxiliary layer 40r is disposed between the first charge auxiliary layer 40p and the second charge auxiliary layer 40q. For example, the first charge auxiliary layer 40p may be in contact with the photoelectric conversion layer 30 and the second charge auxiliary layer 40q may be in contact with the first electrode 10. For example, the first charge auxiliary layer 40p and the third charge auxiliary layer 40r may be in contact with each other, and the second charge auxiliary layer 40q and the third charge auxiliary layer 40r may be in contact with each other.

In the drawing, an example in which the third charge auxiliary layer 40r is disposed between the first charge auxiliary layer 40p and the second charge auxiliary layer 40q is illustrated. However, the third charge auxiliary layer 40r is not limited thereto and may be disposed between the photoelectric conversion layer 30 and the first charge auxiliary layer 40p or between the first electrode 10 and the second charge auxiliary layer 40q.

Figure 10:
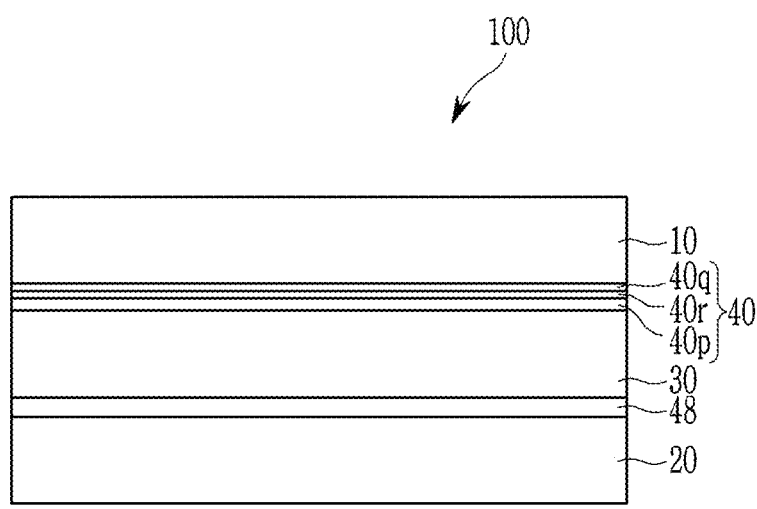
FIG. 10 is a cross-sectional view illustrating an example of a photoelectric conversion device according to some example embodiments.

FIG. 10 is a cross-sectional view illustrating an example of a photoelectric conversion device according to some example embodiments.

Referring to FIG. 10, the photoelectric conversion device 100 according to some example embodiments may include a first electrode 10; a second electrode 20; a photoelectric conversion layer 30; and a charge auxiliary layer 40 including a first charge auxiliary layer 40p, a second charge auxiliary layer 40q, and a third charge auxiliary layer 40r, like some example embodiments.

However, the photoelectric conversion device 100 according to some example embodiments further includes a charge blocking layer 48 between the second electrode 20 and the photoelectric conversion layer 30, unlike some example embodiments. The charge blocking layer 48 may enhance photoelectric conversion efficiency by blocking charges (e.g., electrons) separated from the photoelectric conversion layer 30 from moving to the opposed electrode and details thereof are the same as described above.

The photoelectric conversion device 100 may be applied to various electronic devices, for example a solar cell, an organic sensor, a photodetector, and a photosensor, but is not limited thereto.

The photoelectric conversion device 100 may be for example applied to an organic sensor. The organic sensor may be, for example, a sensor including at least one organic material, and may be, for example, an image sensor, an infrared sensor, or a combination thereof, but is not limited thereto.

Hereinafter, examples of an organic sensor using the photoelectric conversion device 100 will be described with reference to the drawings.

Figure 11:
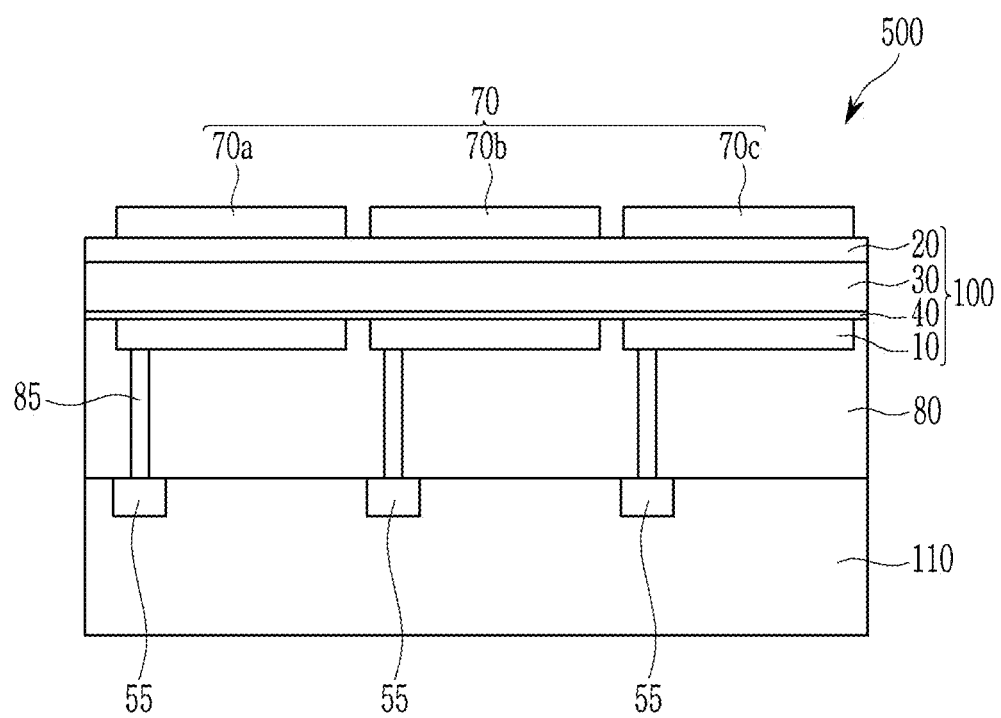
FIG. 11 is a cross-sectional view schematically showing an example of an organic sensor according to some example embodiments.

FIG. 11 is a schematic cross-sectional view showing an example of an organic sensor according to some example embodiments.

For example, the organic sensor may be an organic CMOS image sensor.

Referring to FIG. 11, an organic sensor 500 according to some example embodiments includes a semiconductor substrate 110, an insulation layer 80, a photoelectric conversion device 100, and a color filter layer 70. In some example embodiments, the semiconductor substrate 110 is omitted from the organic sensor according to any example embodiments.

The semiconductor substrate 110 may be a silicon substrate, and is integrated with the transmission transistor (not shown) and the charge storage 55. The transmission transistor and/or the charge storage 55 may be integrated in each pixel. The charge storage 55 is electrically connected to the photoelectric conversion device 100. As shown, the semiconductor substrate 110 is stacked on (e.g., above or beneath) the photoelectric conversion device 100.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and an alloy thereof, but are not limited thereto.

The insulation layer 80 is formed on the metal wire and the pad. The insulation layer 80 may be made of an inorganic insulating material such as a silicon oxide and/or a silicon nitride, or a low dielectric constant (low K) material such as SiC, SiCOH, SiCO, and SiOF. The insulation layer 80 has a trench 85 exposing the charge storage 55. The trench 85 may be filled with fillers.

The photoelectric conversion device 100 is formed on the insulation layer 80. The photoelectric conversion device 100 includes a first electrode 10, a charge auxiliary layer 40, a photoelectric conversion layer 30, and a second electrode 20 as described above. The second electrode 20 may be a light-receiving electrode. The detailed description is the same as described above.

The color filter layer 70 is formed on the photoelectric conversion device 100. The color filter layer 70 includes a blue filter 70a in a blue pixel, a red filter 70b in a red pixel, and a green filter 70c in a green pixel. However, the color filter layer 70 may include a cyan filter, a magenta filter, and/or a yellow filter instead of the above filters or may further include them in addition to the above filters.

Focusing lens (not shown) may be further formed on the color filter layer 70. The focusing lens may control a direction of incident light and collect the light in one region. The focusing lens may have a shape of, for example, a cylinder or a hemisphere, but is not limited thereto.

Even though FIG. 11 shows the structure including the photoelectric conversion device 100 of FIG. 1, structures in which each photoelectric conversion device 100 of FIGS. 2 to 10 is included may be applied in the same manner.

Figure 12:
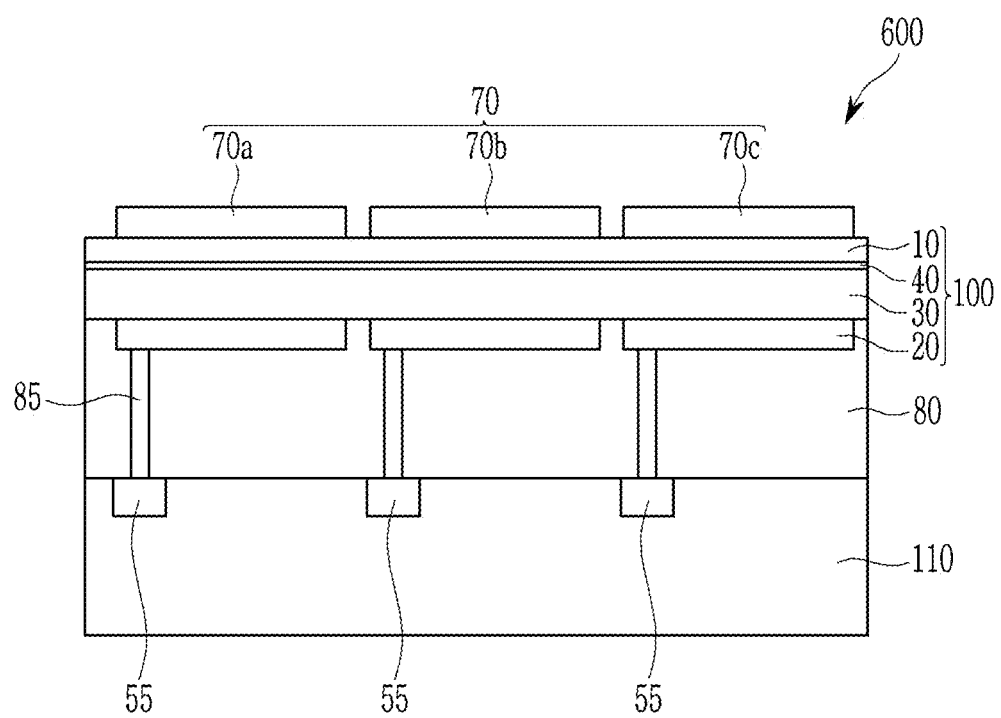
FIG. 12 is a cross-sectional view schematically showing an example of an organic sensor according to some example embodiments.

FIG. 12 is a schematic cross-sectional view showing an example of an organic sensor according to some example embodiments.

Referring to FIG. 12, an image sensor 600 according to some example embodiments includes a semiconductor substrate 110 integrated with a transmission transistor (not shown) and a charge storage 55; an insulation layer 80; a photoelectric conversion device 100; and a color filter layer 70, like some example embodiments.

However, in the image sensor 600 according to some example embodiments, the positions of the first electrode 10 and the second electrode 20 of the photoelectric conversion device 100 are changed, unlike some example embodiments. That is, the first electrode 10 may be a light-receiving electrode.

Even though FIG. 12 shows the structure including the photoelectric conversion device 100 of FIG. 1, structures in which each photoelectric conversion device 100 of FIGS. 2 to 10 is included may be applied in the same manner.

Figure 13:
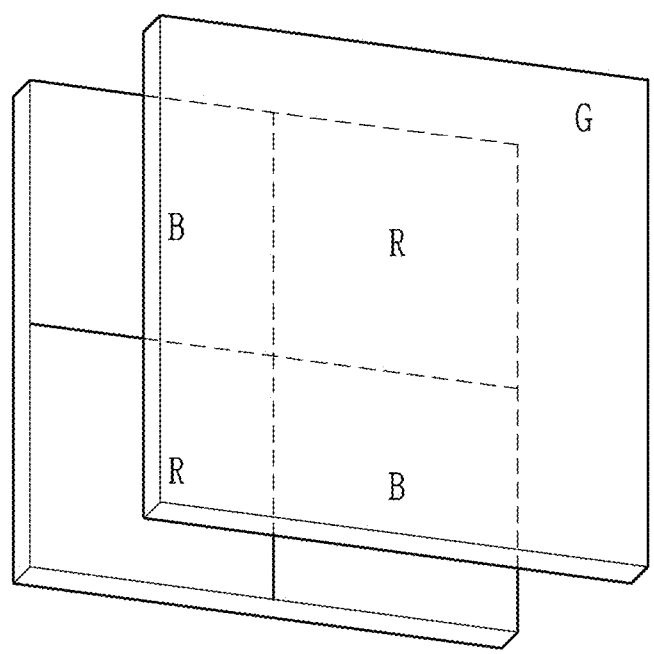
FIG. 13 is a top plan view schematically illustrating an example of an organic sensor according to some example embodiments.
Figure 14:
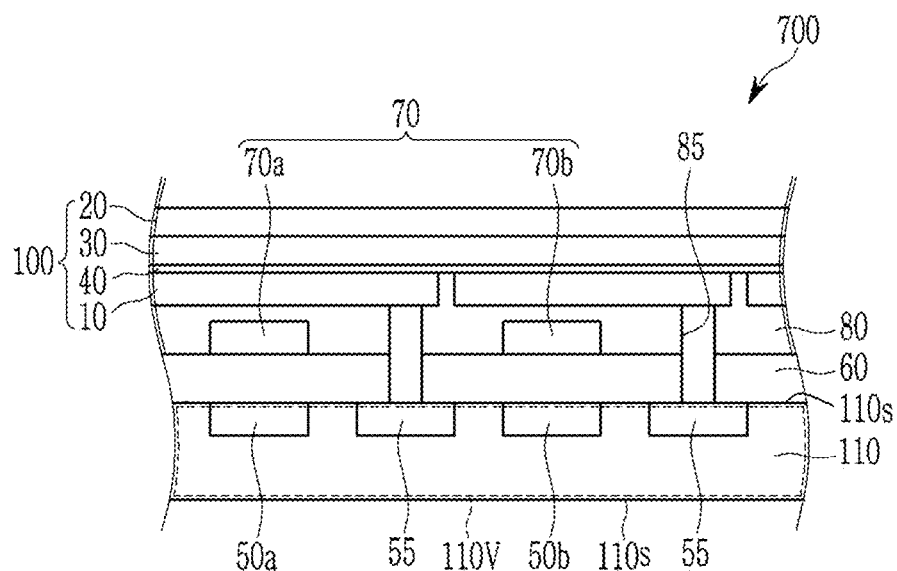
FIGS. 14 and 15 are cross-sectional views schematically illustrating examples of the organic sensor of FIG. 13 according to some example embodiments.
Figure 15:
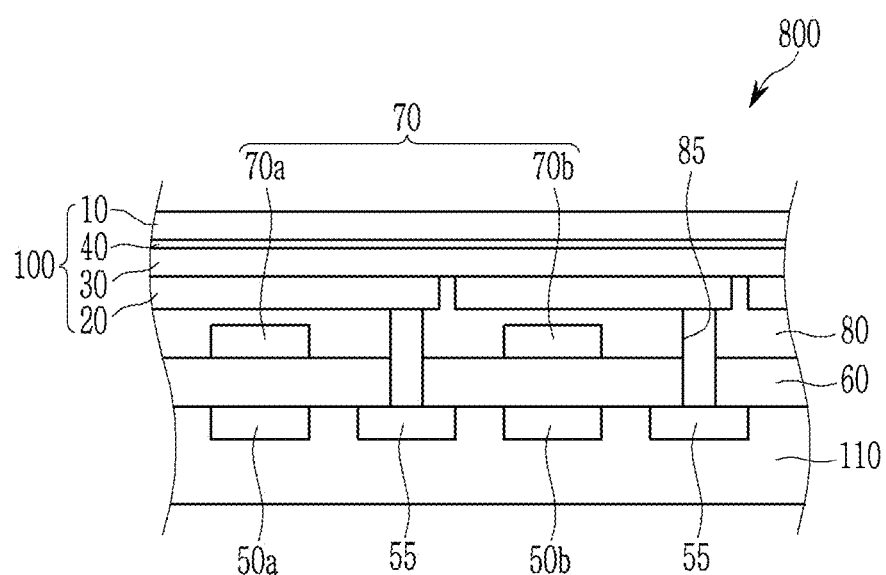

FIG. 13 is a schematic top plan view showing an example of an organic sensor according to some example embodiments and FIGS. 14 and 15 are schematic cross-sectional view showing examples of the organic sensor of FIG. 13 according to some example embodiments.

Referring to FIGS. 13 and 14, an organic sensor 700 according to some example embodiments includes a semiconductor substrate 110; a lower insulation layer 60; a color filter layer 70; an upper insulation layer 80; and a photoelectric conversion device 100.

The semiconductor substrate 110 may be a silicon substrate, and is integrated with the photo-sensing devices 50a and 50b, the transmission transistor (not shown), and the charge storage 55. In some example embodiments, the organic sensor 700 may include a single photo-sensing device, of photo-sensing devices 50a and 50b. The photo-sensing devices 50a and 50b may be photodiodes. As shown in FIG. 14, the photo-sensing device 50a and 50b are at least partially located within a volume space 110v that is defined by outermost surfaces 110S of the semiconductor substrate 110, such that the photo-sensing devices 50a and 50b may each be understood to be "integrated" in the semiconductor substrate 110.

The photo-sensing devices 50a and 50b, the transmission transistor, and/or the charge storage 55 may be integrated in each pixel, and as shown in the drawing, the photo-sensing devices 50a and 50b may be respectively included in a blue pixel and a red pixel and the charge storage 55 may be included in a green pixel.

The photo-sensing devices 50a and 50b sense light, the information sensed by the photo-sensing devices may be transferred by the transmission transistor, the charge storage 55 is electrically connected to the photoelectric conversion device 100 that will be described later, and the information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and an alloy thereof, but are not limited thereto. Further, it is not limited to the structure, and the metal wire and pad may be disposed under the photo-sensing devices 50a and 50b.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench 85 exposing the charge storage 55. The trench 85 may be filled with fillers.

The color filter layer 70 is formed on the lower insulation layer 60. The color filter layer 70 includes a blue filter 70a in a blue pixel and a red filter 70b in a red pixel. In some example embodiments, a green filter is not included, but a green filter may be further included. For another example, the color filter layer 70 may be disposed on the photoelectric conversion device 100.

The upper insulation layer 80 is formed on the color filter layer 70. The upper insulation layer 80 may eliminate a step caused by the color filter layer 70 and smoothen the surface. The upper insulation layer 80 and the lower insulation layer 60 may include a contact hole (not shown) exposing a pad, and a trench 85.

The photoelectric conversion device 100 is formed on the upper insulation layer 80. The photoelectric conversion device 100 includes the first electrode 10, the charge auxiliary layer 40, the photoelectric conversion layer 30, and the second electrode 20 as described above. The second electrode 20 may be a light-receiving electrode. The detailed description is the same as described above.

Focusing lens (not shown) may be further formed on the photoelectric conversion device 100. The focusing lens may control a direction of incident light and collect the light in one region. The focusing lens may have a shape of, for example, a cylinder or a hemisphere, but is not limited thereto.

Referring to FIG. 15, the image sensor 800 according to some example embodiments includes a semiconductor substrate 110 integrated with photo-sensing devices 50a and 50b, a transmission transistor (not shown), and a charge storage 55; a lower insulation layer 60; a color filter layer 70; an upper insulation layer 80; and a photoelectric conversion device 100, like some example embodiments.

However, in the image sensor 800 according to some example embodiments, the positions of the first electrode 10 and the second electrode 20 are changed, unlike some example embodiments. That is, the first electrode 10 may be a light-receiving electrode.

Even though FIGS. 14 and 15 show the structure including the photoelectric conversion device 100 of FIG. 1, structures in which each photoelectric conversion device 100 of FIGS. 2 to 10 is included may be applied in the same manner.

Figure 16:
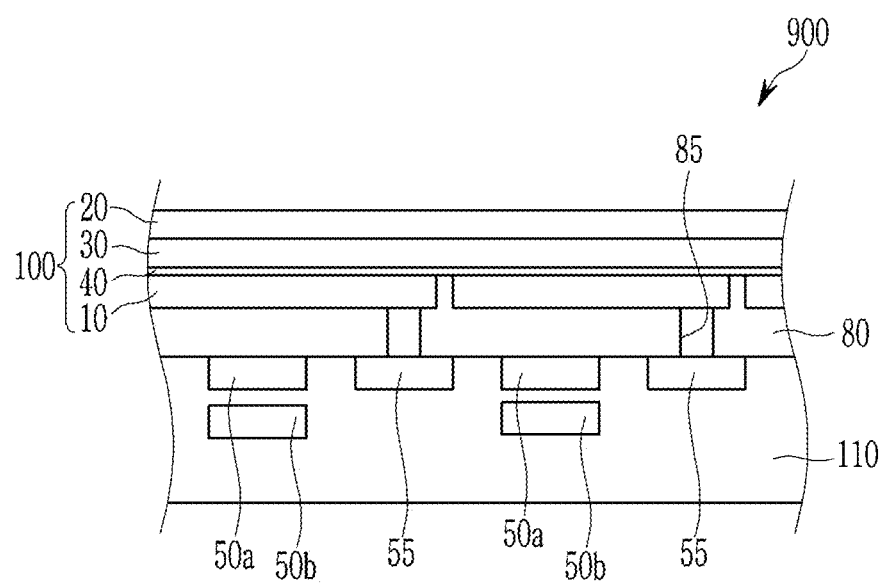
FIG. 16 is a cross-sectional view schematically showing an example of an organic sensor according to some example embodiments.

FIG. 16 is a cross-sectional view schematically showing an example of an organic sensor according to some example embodiments.

An image sensor 900 according to some example embodiments includes a semiconductor substrate 110 integrated with photo-sensing devices 50a and 50b, a transmission transistor (not shown), and a charge storage 55; an insulation layer 80 having a trench 85; and a photoelectric conversion device 100, like some example embodiments.

However, in the image sensor 900 according to some example embodiments, the photo-sensing devices 50a and 50b are stacked in a vertical direction and the color filter layer 70 is omitted, unlike some example embodiments. The photo-sensing devices 50a and 50b are electrically connected to charge storage (not shown) and may be transferred by the transmission transistor. The photo-sensing devices 50a and 50b may be configured to selectively absorb light in each wavelength spectrum depending on a stacking depth.

Even though FIG. 16 show the structure including the photoelectric conversion device 100 of FIG. 1, structures in which each photoelectric conversion device 100 of FIGS. 2 to 10 is included may be applied in the same manner.

Figure 17:
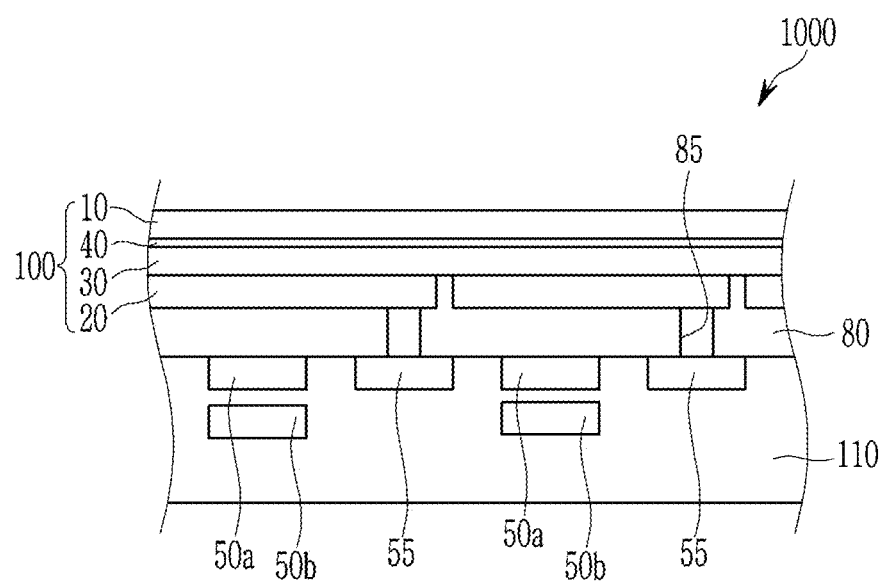
FIG. 17 is a cross-sectional view schematically showing an example of an organic sensor according to some example embodiments.

FIG. 17 is a cross-sectional view schematically showing an example of an organic sensor according to some example embodiments.

Referring to FIG. 17, an image sensor 1000 according to some example embodiments includes a semiconductor substrate 110 integrated with photo-sensing devices 50a and 50b, a transmission transistor (not shown), and a charge storage 55; an insulation layer 80 having a trench 85; and a photoelectric conversion device 100, like some example embodiments. However, in the image sensor 1000 according to some example embodiments, the positions of the first electrode 10 and the second electrode 20 are changed, unlike some example embodiments. That is, the first electrode 10 may be a light-receiving electrode.

Even though FIG. 17 show the structure including the photoelectric conversion device 100 of FIG. 1, structures in which each photoelectric conversion device 100 of FIGS. 2 to 10 is included may be applied in the same manner.

Figure 18:
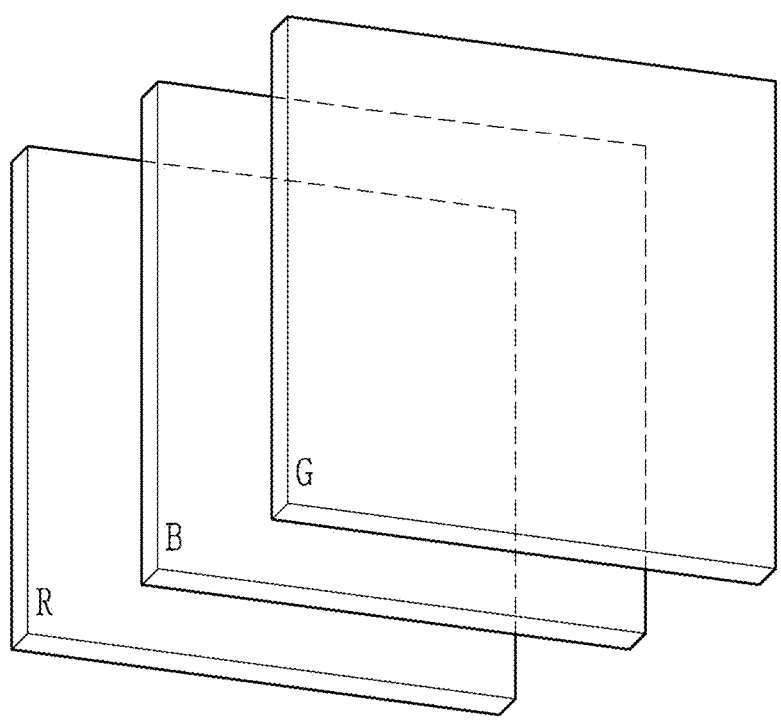
FIG. 18 is a top plan view schematically illustrating an example of an organic sensor according to some example embodiments.
Figure 19:
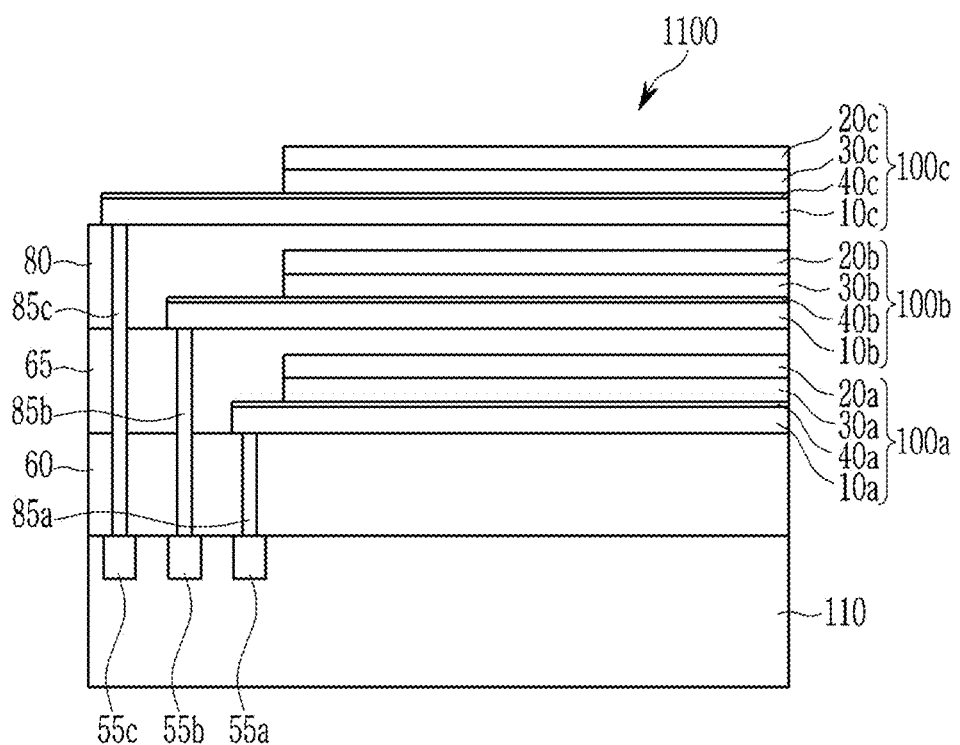
FIGS. 19 and 20 are cross-sectional views illustrating examples of the organic sensor of FIG. 18 according to some example embodiments.
Figure 20:
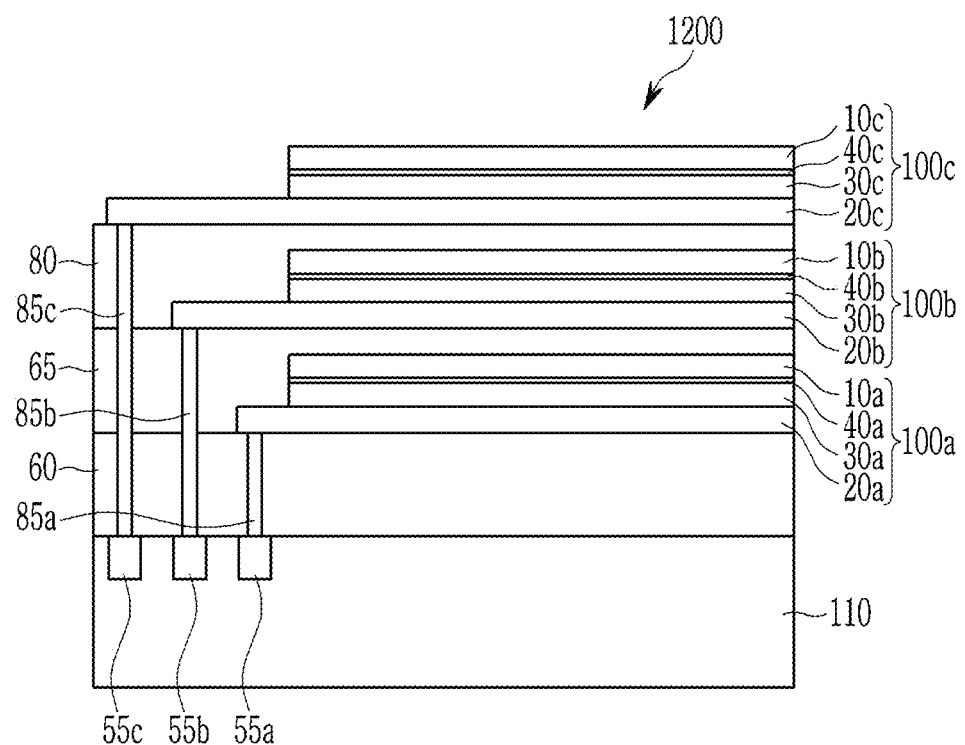

FIG. 18 is a top plan view schematically illustrating an example of an organic sensor according to some example embodiments and FIGS. 19 and 20 are cross-sectional views illustrating examples of the organic sensor of FIG. 18 according to some example embodiments.

Referring to FIGS. 18 and 19, an organic sensor 1100 according to some example embodiments has a structure in which a green photoelectric conversion device configured to selectively absorb light in a green wavelength spectrum, a blue photoelectric conversion device configured to selectively absorb light in a blue wavelength spectrum, and a red photoelectric conversion device configured to selectively absorb light in a red wavelength spectrum are stacked.

The organic sensor 1100 according to some example embodiments includes a semiconductor substrate 110, a lower insulation layer 60, an intermediate insulation layer 65, an upper insulation layer 80, a first photoelectric conversion device 100a, a second photoelectric conversion device 100b, and a third photoelectric conversion device 100c.

The semiconductor substrate 110 may be a silicon substrate, and is integrated with the transmission transistor (not shown), and the charge storage 55a, 55b, and 55c. A metal wire (not shown) and a pad (not shown) are formed on the semiconductor substrate 110, and the lower insulation layer 60 is formed on the metal wire and the pad. The lower insulating layer 60 has a plurality of trenches 85a, 85b, and 85c.

The first photoelectric conversion device 100a is formed on the lower insulation layer 60.

The first photoelectric conversion device 100a includes a first electrode 10a and a second electrode 20a facing each other, and a photoelectric conversion layer 30a and a charge auxiliary layer 40a disposed between the first electrode 10a and the second electrode 20a. The first electrode 10a, the second electrode 20a, the photoelectric conversion layer 30, and the charge auxiliary layer 40a are the same as described above, and the photoelectric conversion layer 30a may selectively absorb light in one of red, blue, or green wavelength spectrums. For example, the first photoelectric conversion device 100a may be a red photoelectric conversion device.

The intermediate insulation layer 65 may be formed on the first photoelectric conversion device 100a. The intermediate insulating layer 65 has a plurality of trenches 85b and 85c.

The second photoelectric conversion device 100b may be formed on the intermediate insulation layer 65.

The second photoelectric conversion device 100b includes a first electrode 10b and a second electrode 20b, and a photoelectric conversion layer 30b and a charge auxiliary layer 40b between the first electrode 10b and the second electrode 20b. The first electrode 10b, the second electrode 20b, the photoelectric conversion layer 30b, and the charge auxiliary layer 40b are the same as described above, and the photoelectric conversion layer 30b may be configured to selectively absorb light in one of red, blue, or green wavelength spectrums. For example, the second photoelectric conversion device 100b may be a blue photoelectric conversion device.

The upper insulation layer 80 may be formed on the second photoelectric conversion device 100b. The upper insulating layer 80 has a plurality of trenches 85c.

The third photoelectric conversion device 100c is formed on the upper insulation layer 80. The third photoelectric conversion device 100c includes a first electrode 10c and a second electrode 20c facing each other, and a photoelectric conversion layer 30c and a charge auxiliary layer 40c disposed between the first electrode 10c and the second electrode 20c. The first electrode 10c, the second electrode 20c, the photoelectric conversion layer 30c, and the charge auxiliary layer 40c are the same as described above, and the photoelectric conversion layer 30c may be configured to selectively absorb light in one of red, blue, or green wavelength spectrums. For example, the third photoelectric conversion device 100c may be a green photoelectric conversion device and may be the photoelectric conversion device 100.

Focusing lens (not shown) may be further formed on the third photoelectric conversion device 100c. The focusing lens may control a direction of incident light and collect the light in one region. The focusing lens may have a shape of, for example, a cylinder or a hemisphere, but is not limited thereto.

Referring to FIG. 20, an image sensor 1200 according to some example embodiments includes a semiconductor substrate 110, a lower insulation layer 60, an intermediate insulation layer 65, an upper insulation layer 80, a first photoelectric conversion device 100a, a second photoelectric conversion device 100b, and a third photoelectric conversion device 100c, like some example embodiments. However, the positions of the first electrode 10 and the second electrode 20 of the first photoelectric conversion device 100a, the second photoelectric conversion device 100b, and the third photoelectric conversion device 100c are changed, unlike some example embodiments. That is, the first electrode 10 may be a light-receiving electrode.

Focusing lens (not shown) may be further formed on the third photoelectric conversion device 100c. The focusing lens may control a direction of incident light and collect the light in one region. The focusing lens may have a shape of, for example, a cylinder or a hemisphere, but is not limited thereto.

Even though FIGS. 19 and 20 show the structure including the photoelectric conversion device 100 of FIG. 1, structures in which each photoelectric conversion device 100 of FIGS. 2 to 10 is included may be applied in the same manner.

In the drawing, the first photoelectric conversion device 100a, the second photoelectric conversion device 100b, and the third photoelectric conversion device 100c are sequentially stacked, but the present disclosure is not limited thereto, and they may be stacked in various orders.

As described above, the first photoelectric conversion device 100a, the second photoelectric conversion device 100b, and the third photoelectric conversion device 100c are stacked, and thus the size of an image sensor may be reduced to realize a down-sized image sensor.

The photoelectric conversion device and organic sensors may be applied to various electronic devices, for example, but not limited to mobile phones, digital cameras, automobile parts, and the like.

Figure 21:
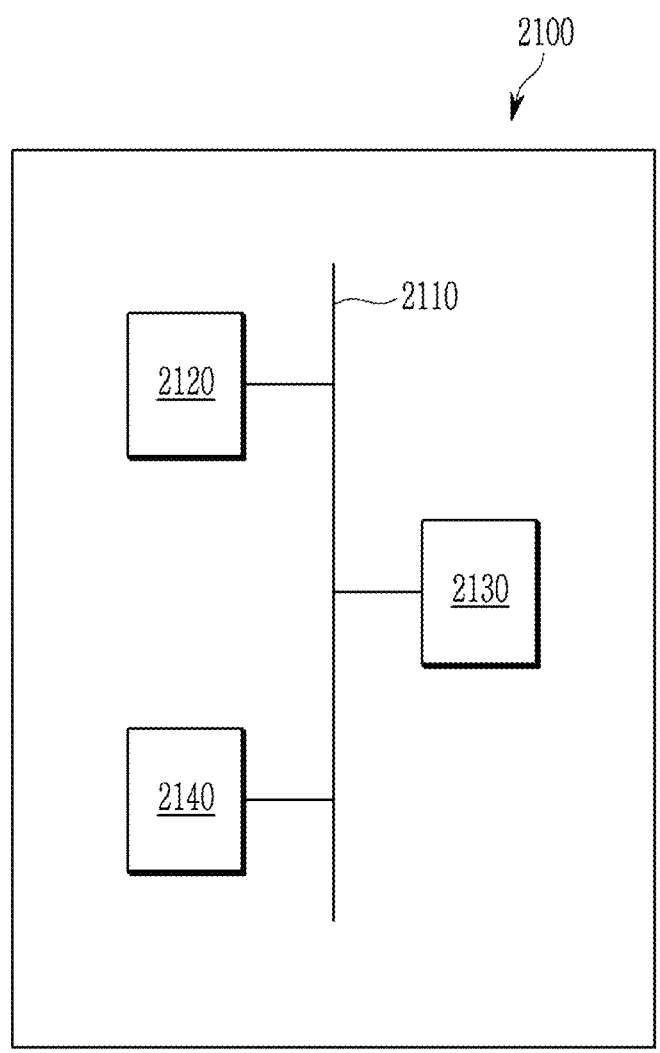
FIG. 21 is a diagram illustrating a device that includes one or more image sensors according to some example embodiments.

FIG. 21 is a diagram illustrating a device that includes one or more image sensors according to some example embodiments.

Referring to FIG. 21, device 2100, which may be an electronic device, includes a bus 2110, a processor 2120, a memory 2130, and one or more additional devices 2140. As shown, in some example embodiments, the processor 2120, a memory 2130, and one or more additional devices 2140 may communicate with one another through the bus 2110.

The one or more additional devices 2140 may each be any of the organic sensors included in any of the example embodiments and/or any of the photoelectric conversion devices according to any of the example embodiments.

The processor 2120 may include one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device, for example a solid state drive (SSD), storing a program of instructions, and a processor configured to execute the program of instructions to implement the functionality of the processor 2120 and/or one or more additional devices 2140.

It will be understood that the memory 2130 may store a program of instructions and the processor 2120 may execute the stored program of instructions to implement functionality associated with the device 2100 and/or one or more additional devices 2140.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

Hereinafter, some example embodiments are illustrated in more detail with reference to examples. However, the present disclosure is not limited to said examples.

Example 1

ITO is sputtered on a glass substrate to provide a 150 nm-thick anode. Subsequently, a compound represented by Chemical Formula A is deposited on the anode to provide a 5 nm-thick charge blocking layer. Then, a p-type semiconductor ($\lambda_{max}$: 545 nm) represented by Chemical Formula B-1 and an n-type semiconductor that is fullerene (C60) are co-deposited on the charge blocking layer in a volume ratio of 1.25:1 to provide a 100 nm-thick photoelectric conversion layer. Yb (WF: 2.6eV) and $GeO_2$ are thermally evaporated in a weight ratio of 1:2 on the photoelectric conversion layer to provide a 2 nm-thick charge auxiliary layer. ITO (WF: 4.7 eV) is sputtered on the charge auxiliary layer to provide a 7 nm-thick cathode. Then, aluminum oxide ($Al_2O_3$) is deposited on the cathode to provide a 40 nm-thick anti-reflection layer and encapsulated with a glass to provide a photoelectric conversion device.

[Chemical Formula A]

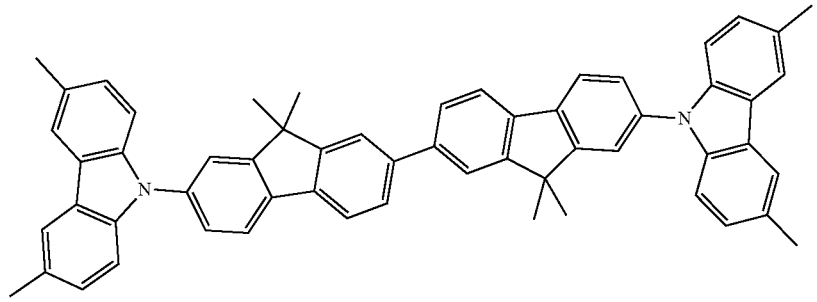

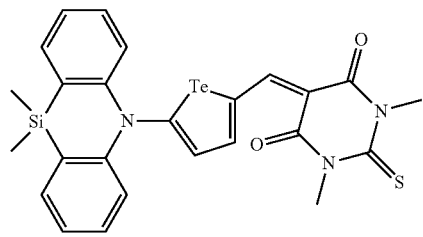

Example 2

A photoelectric conversion device is manufactured in accordance with the same procedure as in Example 1, except that Yb and $GeO_2$ are thermally evaporated in a weight ratio of 1:3 to form the charge auxiliary layer.

Example 3

ITO is sputtered on a glass substrate to provide a 150 nm-thick anode. Subsequently, a compound represented by the Chemical Formula A is deposited on the anode to provide a 5 nm-thick charge blocking layer. Then, a p-type semiconductor represented by the Chemical Formula B-1 and an n-type semiconductor that is fullerene (C60) are co-deposited on the charge blocking layer in a volume ratio of 1.25:1 to provide a 100 nm-thick photoelectric conversion layer. Then, on the photoelectric conversion layer, Yb is thermally evaporated to form a 2 nm-thick first charge auxiliary layer and $GeO_2$ is thermally evaporated to form a 0.5 nm-thick second charge auxiliary layer, forming a two-layered charge auxiliary layer. ITO is sputtered on the two-layered charge auxiliary layer to provide a 7 nm-thick cathode. Then, aluminum oxide ($Al_2O_3$) is deposited on the cathode to provide a 40 nm-thick anti-reflection layer and encapsulated with a glass to provide a photoelectric conversion device.

Example 4

A photoelectric conversion device is manufactured in accordance with the same procedure as in Example 3, except that $GeO_2$ is thermally evaporated on the photoelectric conversion layer to form a 0.5 nm-thick second charge auxiliary layer and Yb is thermally evaporated thereon to form a 2 nm-thick first charge auxiliary layer.

Comparative Example 1

A photoelectric conversion device is manufactured in accordance with the same procedure as in Example 1 (or Example 3) except that the charge auxiliary layer is not formed.

Comparative Example 2

A photoelectric conversion device is manufactured in accordance with the same procedure as in Example 1 (or Example 3), except that $GeO_2$ is thermally evaporated to form a 0.5 nm-thick charge auxiliary layer.

Evaluation I

A photoelectric conversion efficiency according to a wavelength of each photoelectric conversion device according to Examples and Comparative Examples is evaluated.

[Chemical Formula B-1]

The photoelectric conversion efficiency may be evaluated from external quantum efficiency (EQE) at a maximum absorption wavelength ($\lambda_{max}$) (about 540 nm) and evaluated in a wavelength spectrum of 400 nm to 720 nm by Incident Photon to Current Efficiency (IPCE) method.

The results are shown in Table 1.

TABLE 1

|  | EQE (@540 nm, 3 V) (%) |
|---|---|
| Example 1 | 68.1 |
| Example 2 | 69.4 |
| Example 3 | 68.6 |
| Example 4 | 68.2 |
| Comparative Example 1 | 67.2 |
| Comparative Example 2 | 67.7 |

Referring to Table 1, it is confirmed that the photoelectric conversion devices according to Examples exhibit improved photoelectric conversion efficiency compared with the photoelectric conversion device according to Comparative Examples based on including a charge auxiliary layer including a metal and an oxide.

Evaluation II

Remaining electrons characteristics of the photoelectric conversion devices of Example 3 and Comparative Examples 1 and 2 are evaluated.

The remaining electrons characteristics indicate an amount of photoelectrically-converted charges in one frame but not signal-treated and remaining charges and thus read in the next frame. The remaining electrons characteristics are evaluated by irradiating light in a wavelength spectrum in which a photoelectric conversion occurs into the photoelectric conversion devices according to Examples and Comparative Examples for a predetermined time and then, turning the light off, and measuring a current amount per a $10^{-6}$ second unit using a Keithley 2400 equipment.

The results are shown in Table 2.

TABLE 2

|  | Remaining electrons ($h^+$/sec) (30 fps) |
|---|---|
| Example 3 | 3.50 |
| Comparative Example 1 | 4.50 |
| Comparative Example 2 | 4.35 |

* fps: frame per second

Referring to Table 2, the photoelectric conversion device according to Example 3 exhibits improved remaining electrons characteristics compared with the photoelectric conversion devices according to Comparative Examples 1 and 2.

While this disclosure has been described in connection with what is presently considered to be practical example embodiments, it is to be understood that the inventive concepts are not limited to the disclosed example embodiments, but, on the contrary, are intended to cover various modifications and equivalent arrangements included within the spirit and scope of the appended claims.

What is claimed is:

1. A photoelectric conversion device, comprising:
   a first electrode and a second electrode facing each other,
   an organic photoelectric conversion layer between the first electrode and the second electrode, the organic photoelectric conversion layer being configured to absorb light in at least a portion of a wavelength spectrum of incident light and to convert the absorbed light into an electrical signal, and
   a charge auxiliary layer between the first electrode and the organic photoelectric conversion layer, the charge auxiliary layer including a metal and an oxide, a work function of the metal being lower than a work function of the first electrode,
   wherein the metal includes a lanthanide element, calcium (Ca), potassium (K), aluminum (Al), an alloy thereof, or a combination thereof, and
   wherein the oxide includes germanium oxide, gallium oxide, selenium oxide, strontium oxide, lanthanum oxide, neodymium oxide, gadolinium oxide, ytterbium oxide, lutetium oxide, or a combination thereof.

2. The photoelectric conversion device of claim 1, wherein the lanthanide element includes ytterbium (Yb).

3. The photoelectric conversion device of claim 1, wherein the charge auxiliary layer includes a mixture of the metal and the oxide.

4. The photoelectric conversion device of claim 3, wherein a total amount of the oxide in the charge auxiliary layer is greater than a total amount of the metal in the charge auxiliary layer.

5. The photoelectric conversion device of claim 4, wherein a ratio of the total amount of the metal in the charge auxiliary layer and the total amount of the oxide in the charge auxiliary layer is a weight ratio of about 1:2 to about 1:5.

6. The photoelectric conversion device of claim 3, wherein a thickness of the charge auxiliary layer is greater than or equal to about 0.2 nm and less than or equal to about 5 nm.

7. The photoelectric conversion device of claim 1, wherein
   the charge auxiliary layer comprises:
      a first charge auxiliary layer including the metal, and
      a second charge auxiliary layer including the oxide.

8. The photoelectric conversion device of claim 7, wherein
   the first charge auxiliary layer is in contact with the first electrode, and
   the second charge auxiliary layer is in contact with the organic photoelectric conversion layer.

9. The photoelectric conversion device of claim 7, wherein
   the first charge auxiliary layer is in contact with the organic photoelectric conversion layer, and
   the second charge auxiliary layer is in contact with the first electrode.

10. The photoelectric conversion device of claim 7, wherein the first charge auxiliary layer is thicker than the second charge auxiliary layer.

11. The photoelectric conversion device of claim 10, wherein a thickness of the first charge auxiliary layer is about 2 to 8 times of a thickness of the second charge auxiliary layer.

12. The photoelectric conversion device of claim 7, wherein the charge auxiliary layer further includes a third charge auxiliary layer, the third charge auxiliary layer including a mixture of the metal and the oxide.

13. The photoelectric conversion device of claim 1, wherein the first electrode is a cathode and the second electrode is an anode.

14. An organic sensor comprising the photoelectric conversion device of claim 1.

15. The organic sensor of claim 14, further comprising a semiconductor substrate, the semiconductor substrate stacked above or beneath the photoelectric conversion device.

16. The organic sensor of claim 15, further comprising a photodiode, the photodiode being integrated in the semiconductor substrate.

17. An electronic device comprising the organic sensor of claim 4.

* * * * *